(12) United States Patent
Tsukamoto et al.

(10) Patent No.: US 6,288,665 B1
(45) Date of Patent: Sep. 11, 2001

(54) ANALOG TO DIGITAL CONVERTER, ENCODER, AND RECORDED DATA REPRODUCING APPARATUS

(75) Inventors: Sanroku Tsukamoto, Kasugai (JP); Ian Dedic, London (GB); Kuniyoshi Kamei; Toshiaki Endo, both of Kasugai (JP); Masaru Sawada; Hiroko Murakami, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/568,243

(22) Filed: May 9, 2000

Related U.S. Application Data

(62) Division of application No. 08/603,607, filed on Feb. 21, 1996, now Pat. No. 6,046,694.

(30) Foreign Application Priority Data

| Feb. 22, 1995 | (JP) | 7-034076 |
| Aug. 11, 1995 | (JP) | 7-206226 |
| Sep. 8, 1995 | (JP) | 7-231757 |

(51) Int. Cl.[7] .................................................. H03M 1/12
(52) U.S. Cl. ....................... 341/155; 341/172; 341/159
(58) Field of Search ................................. 341/172, 165, 341/159, 156, 145, 155, 161, 158, 126, 128

(56) References Cited

U.S. PATENT DOCUMENTS

| 4,855,863 | 8/1989 | Yoshitake | 361/91 |
| 4,963,874 | 10/1990 | Matsuzawa et al. | 341/159 |
| 5,184,131 | * | 2/1993 | Ikeda | 341/165 |
| 5,402,128 | * | 3/1995 | Kusumoto et al. | 341/172 |
| 5,450,085 | 9/1995 | Stewart . | |

FOREIGN PATENT DOCUMENTS

| 444890A2 | 2/1991 | (EP) . |
| 55-118221 | 9/1980 | (JP) . |
| 57-204633 | 12/1982 | (JP) . |
| 59-152718 | 8/1984 | (JP) . |
| 60-213118 | 10/1985 | (JP) . |
| 61-270919 | 12/1986 | (JP) . |
| 62-43217 | 2/1987 | (JP) . |
| 63-144617 | 6/1988 | (JP) . |
| 64-44128 | 2/1989 | (JP) . |
| 1-2210 | 5/1989 | (JP) . |
| 1-296466 | 11/1989 | (JP) . |
| 1-321728 | 12/1989 | (JP) . |
| 3-250816 | 11/1991 | (JP) . |
| 6-132824 | 5/1994 | (JP) . |
| WO90/01835 | 2/1990 | (WO) . |

* cited by examiner

*Primary Examiner*—Brian Young
*Assistant Examiner*—John Nguyen
(74) *Attorney, Agent, or Firm*—Arent Fox Kintner Plotkin & Kahn, PLLC

(57) ABSTRACT

An encoder for an A/D converter includes a plurality of ROM cells connected between bit lines and word lines. Each of the ROM cells is responsive to a word line select signal supplied to a word line associated with each of the ROM cells for supplying a digital output signal according to the word line select signal to a bit line associated with each of the ROM cells. A logic processor is coupled to one of the bit lines and to two of the word lines used to select a ROM cell connected to the bit line. The logic processor produces an output signal indicative of a selection of the ROM cell connected to the bit line, based on word line select signals supplied on the two word lines.

27 Claims, 27 Drawing Sheets

US 6,288,665 B1

ANALOG TO DIGITAL CONVERTER, ENCODER, AND RECORDED DATA REPRODUCING APPARATUS

This application is a divisional application filed under 37 CFR §1.53(b) of parent application Ser. No. 08/603,607, filed Feb. 21, 1996, now U.S. Pat. No. 6,046,694.

BACKGROUND OF THE INVENTION

1. Field of the Invention

The present invention relates to Analog to Digital (A/D) converters for converting analog signals to a digital signals, and to a recorded data reproducing apparatus for reading out write data from a recording medium.

2. Description of the Related Art

Recently, A/D converters have been used in various electronic devices which have a growing demand for faster A/D conversion. A typical A/D converter comprises a plurality of comparator sections for comparing analog input signals with analog reference voltages and an encoder section for converting the output signals of the comparator sections to digital signals consisting of a plurality of bits. To increase A/D conversion speed, it is necessary to improve the operation speeds of both the comparator sections and the encoder sections.

One type of A/D converter is a parallel type A/D converter, which is superior to other types of A/D converters in terms of A/D conversion speed. FIG. 1 shows a conventional parallel type A/D converter, which outputs a 5-bit digital output signal. Thirty-two resistors R are connected in series between a high-potential reference voltage supply VRH and a low-potential reference voltage supply $V_{RL}$. Each of the two resistors R respectively located at the top and bottom ends of the resistor series circuit has half the resistance of each of the other thirty resistors R.

The A/D converter includes thirty-one comparators CM1 to CM31 each having first and second input terminals. Thirty-one nodes between the thirty-two resistors R are connected to the first input terminals of the comparators CM1–CM31, respectively. Therefore, the individual comparators CM1–CM31 are respectively supplied with reference voltages $V_{R1}$ to $V_{R31}$, which are determined by dividing the potential difference between high and low reference voltages $V_{RH}$ and $V_{RL}$ by the resistors. An analog input signal $A_{in}$ is supplied to the second input terminals of the comparators CM1–CM31. The comparators CM1–CM31 operate based on a control signal output from a control circuit (not shown) and compare the analog input signal $A_{in}$ with the respective received reference voltage signal $V_{R1}$–$V_{R31}$.

The comparators CM1–CM31 have an identical structure and the internal circuit of each comparator is illustrated in FIG. 2. The first and second input terminals receive a reference voltage $V_R$ and an analog input signal $A_{in}$, respectively, and are connected to a node N13 which is the first terminal of a capacitor C3 via switch circuits SW11 and SW10, respectively. The switch circuits SW10 and SW11 are controlled by a pair of associated control signals CS4 and CS5 provided by the aforementioned control circuit, and are switched on when the associated control signals CS4 and CS5 are high.

A node N14 represents a second terminal of capacitor C3 which is connected to the input terminal of an inverter circuit 4h whose output terminal is connected to its input terminal via a switch circuit SW12. The switch circuit SW12 is controlled based on the control signal CS4, and is switched on when the control signal CS4 goes high. The output signal of the inverter circuit 4h is supplied via a capacitor C4 to an inverter circuit 4i whose input and output terminals are connected together via a switch circuit SW13. The switch circuit SW13 is controlled by the control signal CS5, and is switched on when the control signal CS5 goes high. An output signal S is output by the output terminal of the inverter circuit 4i and is also inverted by an inverter circuit 4j, yielding an output signal /S.

The operation of the comparator CM shown in FIG. 2 will be now described with reference to FIG. 3. When control signal CS5 is at a L (Low) level and control signal CS4 is at a H (High) level, the switch circuit SW11 is switched off and the switch circuits SW10, SW12 and SW13 are switched on. As a result, the potentials at node N14 and the output terminal of the inverter circuit 4h are reset to a threshold voltage of the inverter circuit 4h. This causes the charge current to flow into the capacitor C3 and causes the potential at node N13 to become the potential level of the analog input signal $A_{in}$. The potentials at the input and output terminals of the inverter circuit 4i are reset to a threshold voltage of the inverter circuit 4i.

When the control signal CS4 goes low and the control signal CS5 goes high, the switch circuits SW10, SW12 and SW13 are switched off and the switch circuit SW11 is switched on. Consequently, the reference voltage $V_R$ is compared with the potential level of the analog input signal $A_{in}$. When the reference voltage $V_R$ is higher than the potential level of the analog input signal $A_{in}$, the potential at node N14 becomes higher than the threshold voltage of the inverter circuit 4h due to capacitive coupling by the capacitor C3, and the output signal of the inverter circuit 4h becomes low. As a result, the potential level on the input side of the inverter circuit 4i becomes lower than the threshold voltage of this inverter circuit 4i due to capacitive coupling by the capacitor C4. Consequently, the output signal S goes high and the output signal /S goes low.

When the reference voltage $V_R$ is lower than the potential level of the analog input signal $A_{in}$, the potential at node N14 becomes lower than the threshold voltage of the inverter circuit 4h due to capacitive coupling by the capacitor C3, and the output signal of the inverter circuit 4h goes high. As a result, the potential level on the input side of the inverter circuit 4i becomes higher than the threshold voltage of this inverter circuit 4i due to capacitive coupling by the capacitor C4. Consequently, the output signal S goes low and the output signal /S goes high.

When the control signal CS4 goes high and the control signal CS5 goes low, the potential at node N13 is reset to the potential level of the analog input signal $A_{in}$ and the potentials at the input and output terminals of the inverter circuits 4h and 4i are reset to the threshold voltages of the associated inverter circuits 4h and 4i. When the levels of the control signals CS4 and CS5 are changed, the reference voltage $V_R$ is (once again) compared with the potential level of the analog input signal $A_{in}$ and the above-described operation will be repeated.

When the potential level of the analog input signal $A_{in}$ is lower than the received reference voltage (one of $V_{R1}$ to $V_{R31}$), each of the comparators CM1 to CM31 (each having the internal structure shown in FIG. 2) outputs an H (High)-level output signal (one of output signals S1 to S31) and an L (Low)-level output signal (one of signals /S1 to /S31). On the other hand, when the potential level of the analog input signal $A_{in}$ is higher than the received reference voltage (voltages $V_{R1}$ to $V_{R31}$), each comparator outputs an L-level output signal (one of the signals S1 to S31) and an H-level output signal (one of the signals /S1 to /S31).

For example, when the potential level of analog input signal $A_{in}$ is higher than a reference voltage $V_{R4}$ but lower than the reference voltage $V_{R1}$, output signals S1 to S4 corresponding to comparators CM1 to CM4 will go high, while output signals /S1 to /S4 will go low. Output signals S5 to S31 representing the upper twenty-seven comparators CM5 to CM31 will go low while output signals /S5 to /S31 go high.

The output signals S1–S31 and /S1–/S31 of the comparators CM1–CM31 are coupled to thirty-two 2-input NOR gates DE0 to DE31, which function as an address decoder. More specifically, the output signals S1–S31 of the comparators CM1–CM31 are supplied to the first input terminals of the NOR gates DE1 to DE31, while the output signals /S1–/S31 of the comparators CM1–CM31 are supplied to the second input terminals of the NOR gates DE0 to DE30. Each of the NOR gates DE0 and DE31 have one input terminal connected to ground GND.

With this structure, when both input signals become L-level, each of the NOR gates DE0–DE31 output a H-level signal. When comparators CM1–CM31 are patterned this way, only one of the thirty-two NOR gates outputs an H-level signal.

The output signals of the NOR gates DE0–DE31 are supplied to thirty-two word lines WL0 to WL31 of an encoder 1 which represents a ROM. The encoder 1 has five bit lines BL0 to BL4 laid out in association with 1-bit digital output signals D0 to D4 consisting of a total of five bits. A plurality of ROM cells 2 are connected between the word lines WL0–WL31 and the bit lines BL0–BL4 so as to be able to produce $2^5$ (=32) binary signals. Each ROM cell 2 has an N channel MOS transistor which has a gate connected to the associated word line, a drain connected to the associated bit line and a source connected to the ground GND, as shown in FIG. 4.

As shown in FIG. 1, the bit lines BL0–BL4 are connected to a power supply $V_{DD}$ via switch circuits SW0 to SW4, respectively. When switch circuits SW0–SW4 are switched on, the bit lines BL0–BL4 are precharged. Each of the switch circuits SW0–SW4 is consists of a P channel MOS transistor.

When the potential level of one of the word lines goes high after the switch circuits SW0–SW4 are opened, the ROM cells 2 connected to that word line are enabled and the potential levels of the bit lines which are connected to those ROM cells 2 goes low. For example, when potential level of the word line WL0 goes high, the digital output signals D0–D4 consisting of a total of five bits become "00000". When potential level of the word line WL2 goes high, the digital output signals D0–D4 become "00010".

FIG. 5 illustrates another conventional parallel A/D converter for a 2-bit digital output. Four resistors R are connected in series between a high-potential reference voltage supply $V_{RH}$ and a low-potential reference voltage supply $V_{RL}$. Each of the two resistors R respectively located at the top and bottom ends of the resistor series circuit have half the resistance of each of the two remaining resistors R. The A/D converter further includes an encoder section 3, a control circuit 4 and three comparators CM1 to CM3 each having first and second input terminals.

Three nodes between the individual resistors R are respectively connected to the first input terminals of the comparators CM1–CM3. Therefore, each of the individual comparators CM1–CM3 is respectively supplied with reference voltages $V_{R1}$ to $V_{R3}$. An analog input signal $A_{in}$ is supplied to the second input terminals of the comparators CM1–CM3.

As a result, the individual comparators CM1–CM3 compare the analog input signal $A_{in}$ with each of the received reference voltage signal $V_{R1}$ to $V_{R3}$. When the potential level of the analog input signal $A_{in}$ is higher than the received reference voltage signals, the comparators CM1–CM3 output H-level output signals S1–S3. On the other hand, when the potential level of the analog input signal $A_{in}$ is lower than the received reference voltage signals, the comparators CM1–CM3 output L-level output signals S1–S3. For example, when the potential level of the analog input signal $A_{in}$ is higher than the reference voltage $V_{R2}$ but lower than the reference voltage $V_{R3}$, output signals SG1 and SG2 go high and an output signal SG3 goes low. That is, the output signals SG1 to SG3 behave according to a thermometer code. In accordance with the thermometer code, the output signal of the comparator which is supplied with the reference voltage lower than the potential level of the analog input signal $A_{in}$ goes to an H-level, while the output signal of the comparator which is supplied with a reference voltage higher than the potential level of the analog input signal $A_{in}$ goes to an L-level.

The output signals SG1–SG3 are supplied to the encoder section 3 from the comparators CM1–CM3. The operation timings of the comparators CM1–CM3 and the encoder section 3 are controlled by the control circuit 4. The address decoder and the encoder section 3 output digital output signals D0 and D1, each consisting of a single bit.

Referring now to FIG. 6. The comparators CM1–CM3 are shown being a chopper type. The two input terminals of each comparator, which respectively receive a reference voltage $V_R$ and an analog input signal $A_{in}$, are connected via associated switch circuits SW5 and SW6 to a node N11 at the input-side end of a capacitor C1. The switch circuits SW5 and SW6 are controlled by a control signal CS1 and a control signal CS2 from the control circuit 4 of FIG. 5. In other words, the switch circuits SW5 and SW6 are switched on when control signals CS1 and CS2 go high.

A node N12 at the second end of capacitor C1 is connected to the input terminal of an inverter circuit 4a, and is also connected to the output terminal of the inverter circuit 4a via a switch circuit SW7. Switch circuit SW7 is controlled by the control signal CS1 such that it is switched on when the control signal CS1 goes high. The output signal of the inverter circuit 4a is supplied to the input terminal of an inverter circuit 4c via an inverter circuit 4b and a switch circuit SW8. This switch circuit SW8 is controlled by a control signal CS3 so that it is switched on when the control signal CS3 goes high.

The output signal of the inverter circuit 4c is inverted by an inverter circuit 4e and the inverted signal is sent out as an output signal OUT. Further, the output signal of the inverter circuit 4c is returned to the inverter circuit 4c via an inverter circuit 4d and a switch circuit SW9. This switch circuit SW9 is controlled by a control signal /CS3, representing an inverted control signal CS3, such that it is switched on when the control signal /CS3 goes high.

The operation of the chopper type comparator shown in FIG. 6 will now be discussed with reference to FIG. 7. Control signals CS2 and CS3 are supplied as inverted signals of control signal CS1. When the control signal CS1 goes high and the CS2 goes low, the switch circuits SW5 and SW7 are switched on and the switch circuit SW6 is switched off. Consequently, the potential at node N12 is reset to the threshold voltage of the inverter circuit 4a, allowing the charge current to flow into the capacitor C1 so that the potential level at node N11 becomes the level of the reference voltage $V_R$.

When control signal CS1 goes low and control signals CS2 and CS3 go high then, the switch circuits SW5 and SW7 are switched off and the switch circuit SW6 is switched on. Consequently, the reference voltage $V_R$ is compared with the potential level of analog input signal $A_{in}$. When the potential level of the analog input signal $A_{in}$ is higher than the reference voltage $V_R$, the potential at node N12 becomes higher than the threshold voltage of the inverter circuit 4a due to capacitive coupling by the capacitor C1. When the potential level of the analog input signal $A_{in}$ is lower than the reference voltage $V_R$, the potential at node N12 becomes lower than the threshold voltage of the inverter circuit 4a of FIG. 6. As the switch circuit SW8 is switched on at this time, the output signal of the inverter circuit 4a is supplied to the inverter circuit 4c via the inverter circuit 4b and the switch circuit SW8. The output signal of the inverter circuit 4c is sent out as an output signal OUT via the inverter circuit 4e.

When the control signal CS1 goes high and the control signals CS2 and CS3 go low again, the potential at node N11 is reset to the potential level of the reference voltage $V_R$ and the potential level at node N12 is reset to the threshold voltage of the inverter circuit 4a. In this case, switch circuit SW9 is switched on. As a result, the inverter circuits 4c and 4d constitute a latch circuit that latches the output signal OUT. When the levels of the control signals CS1 to CS3 are changed, the potential level of the analog input signal $A_{in}$ is compared again with the reference voltage $V_R$ and the above-described operation will be repeated.

In the conventional analog to digital (A/D) converter shown in FIG. 1, sixteen N channel MOS transistors are connected as the ROM cells 2 to the five bit lines BL0 to BL4 in the encoder 1. The number of the necessary transistors doubles as the number of the digital output signal increases by one bit. Unfortunately, increasing the number of bits of a digital output signal generally tends to increase the parasitic capacitance of each bit line. This increases the load with respect to each ROM cell 2, which also decreases the operation speed of the encoder 1 and increases power consumption during the precharge operation.

When the potential difference between two reference voltages $V_{Rn}$ and $V_{Rn+1}$ decreases due to an increased number of bits of the output signal, or when noise is mixed in with the reference voltages $V_{RH}$ and $V_{RL}$ or the analog input signal $A_{in}$, the output signals between a plurality of adjacent sets of comparators may be inverted. In such a case, unfortunately, two or more NOR gates output H-level output signals simultaneously so that an erroneous digital output signal is produced.

One proposed way to prevent this erroneous operation is to provide the address decoder with an error correcting function. This proposal, however, complicates the circuit design of the address decoder.

The output signals S of the chopper type comparators CM1–CM31 should have amplitudes high enough for the NOR gates DE0–DE31 at a subsequent stage to identify whether the associated output signals S are "0" or "1". At the time of the comparison, however, the output signals S from the chopper type comparators CM1–CM31 have full amplitudes which vary between the high potential level of the high-potential reference voltage supply and the low potential level of the low-potential reference voltage supply. It therefore takes time for the reset operation of resetting the potential levels at the input and output terminals of the inverter circuits 4h and 4i to the threshold voltages thereof from the potential level of the high-potential reference voltage supply or the potential level of the low-potential reference voltage supply.

Therefore, even if the frequencies of control signals CS4 and CS5 are increased to improve the operation speed, the reset operation and the comparison operation cannot follow up the changes in control signals CS4 and CS5. It is apparent from this situation that when the speed of the reset operation is slower than the operation speed of the encoder 1, the speed of analog to digital conversion is limited by the speed of the reset operation, as such the speed of the A/D conversion cannot be increased.

Likewise, the comparators CM1–CM3 of the A/D converter shown in FIG. 5 repeat the operation of resetting the potentials at nodes N11 and N12 and the comparison of the reference voltage $V_R$ with the analog input signal $A_{in}$. In other words, half of the A/D conversion time is spent during the reset operation. This is one cause of making the A/D conversion slower. Even if the frequencies of the control signals CS1–CS3 are increased in an attempt to improve operation speed, the reset operation and the comparison operation through the capacitor C1 cannot follow up the changes in the control signals CS1–CS3. Thus, the speed of the A/D conversion cannot be increased.

If the number of comparators is increased to increase the number of bits of a digital output signal, charge and discharge currents simultaneously flow between the source of the reference voltage $V_R$ and the capacitor C1 of each comparator in the reset operation, and charge and discharge currents simultaneously flow between the source of the analog input signal $A_{in}$ and each capacitor C1 in the comparison operation. Because the input and output terminals of the inverter circuits 4a of the individual comparators are reset to the threshold voltages at a time, a flowthrough current simultaneously flows into the individual inverter circuits 4a. Noise is therefore apt to be produced in the reference voltage $V_R$, the analog input signal $A_{in}$ and the supply voltages so that an erroneous operation is likely to occur due to the noise.

This patent application will also discuss a recorded data reproducing apparatus for reading out written data from a recording medium like a magnetic disk.

Data which is read from a magnetic hard disk by a reading head is supplied as an analog signal. The analog signal of the read data is converted to a digital signal by an A/D converter. This digital signal undergoes various kinds of digital processes to be reproduced as recorded data. To increase the speed of such reproduction of recorded data, recently, attempts have been made to improve the data recording density of a recording medium and improve the speed of processing digital signals. There is thus a need to improve the precision of A/D converters that are used in recorded data reproducing apparatuses.

In a typical recorded data reproducing apparatus, analog data read from a recording medium like a magnetic disk by the reading head is amplified by an amplifier and the output signal of that amplifier is supplied to an A/D converter via an analog equalizer filter. The A/D converter converts the input analog signal to a digital signal and supplies the digital signal to a digital processing circuit located at the next stage. The digital processing circuit performs digital processing such as a decoding process on the received digital signal to reproduce recorded data.

An offset voltage may occur in the signal that is input to the A/D converter via the analog equalizer filter due to a change in ambient temperature, a variation in power supply voltage or a chronological change in the precision of individual circuits located at the preceding stage of the magnetic disk and the A/D converter. When an offset voltage is produced in the input signal to the A/D converter, the accurate A/D conversion becomes impossible. It is known to provide an offset canceling circuit for canceling an offset voltage is provided on the input side of the A/D converter.

The offset canceling circuit includes a circuit for canceling an offset voltage based on the adjustment of an external part like a resistor, or a feedback circuit which provides an external MPU with the output signal of the A/D converter, converts a digital control signal computed by the MPU based on the output signal of the A/D converter to an analog signal by a D/A converter and uses the analog signal to cancel an offset voltage.

However, the offset canceling circuit using an external part cannot properly cope with a variation in offset voltage. Hence, the use of such offset canceling circuits cannot sufficiently improve the precision of A/D conversion.

The use of the offset canceling circuit which cooperates with an external MPU cannot be a decisive factor to accomplish an A/D conversion with an excellent precision for at least the following reason. If the A/D conversion speed of an A/D converter is increased in accordance with recent improvements in the speed at which data can be read, the amount of the computation of the digital control signal by the MPU increases. This increases the load on the MPU, which brings about new problems such as delaying other processes that should be executed by the MPU.

SUMMARY OF THE INVENTION

Broadly speaking, the present invention relates to a parallel type A/D converter which performs fast A/D conversion with a high precision. This invention also relates to an A/D converter which can reduce consumed power and has an improved conversion precision.

This invention further relates to a semiconductor integrated circuit which cancels an offset voltage to be input to an A/D converter without using an external arithmetic operation unit, thereby improving the precision of A/D conversion.

An encoder according to the first aspect of the present invention is illustrated in FIG. 8. The encoder has a plurality of ROM cells 42 connected between a plurality of bit lines BL and a plurality of word lines WL. Those ROM cells 42 operate based on a word line select signal sent on the word lines WL to allow a digital output signal Dout associated with the select signal to be output from the bit lines BL. The encoder includes at least one logic processor 41 which is connected to a specific one of the bit lines BL. The specific bit line BL is connected via the logic processor 41 to the word line WL for selecting the ROM cells 42 connected to that specific bit line BL. In response to the output signal of the logic processor 41, therefore, the ROM cells 42 on the specific bit line BL are selected. According to the encoder, the number of the ROM cells 42 connected to the specific bit line BL is reduced.

An A/D converter according to the second aspect of the invention includes a plurality of comparators, an address decoder and an encoder section. Those comparators receive reference voltages respectively having different voltage values. Each comparator compares the received reference voltage with an analog input voltage and produces an output according to a thermometer code. The address decoder outputs an address signal for selecting a specific address based on the output signals of the comparators. The encoder section includes a plurality of ROM cells connected between a plurality of bit lines and a plurality of word lines. In response to the selection of a word line, the ROM cells permit a digital signal associated with the selected word line to be output from the bit lines. As a specific word line is selected based on the address signal, a digital output signal is output from the bit lines. At least two word lines for selecting the ROM cells which are connected to a specific single bit line are connected to a logical sum circuit. When any of the word lines connected to the logical sum circuit is selected in the A/D converter, the ROM cells connected to the logical sum circuit are driven and a digital output signal is output from the associated bit lines.

An A/D converter according to the third aspect of this invention includes a reference voltage generator 43, a plurality of comparators CM, a control circuit 31, an encoder 32 and first and second selectors 44 and 45, as shown in FIG. 9. The reference voltage generator 43 generates reference voltages $V_{R1}$ to $V_{R3}$ as a plurality of different analog voltages. The individual comparators CM compare the received reference voltages $V_{R1}$–$V_{R3}$ with an analog input voltage $A_{in}$ and produce outputs according to a thermometer code. The encoder 32 converts thermometer-code based outputs, which are supplied from the comparators CM via the first selector 44, to a digital output signal Dout consisting of a plurality of bits. The control circuit 31 controls the comparators CM in such a manner that the comparators CM alternately perform the comparison operation and reset operation. The number of the comparators CM is greater at least one than the number of the outputs according to the thermometer code.

The control circuit 31 allows the comparators CM which are equal in number to the number of thermometer-code based outputs to perform the comparison operation and allows the remaining comparators CM to perform the reset operation. Based on the output signal of the control circuit 31, the first selector 44 selects the output signals from the comparators CM which are executing the comparison operation, and sends the selected output signals to the encoder 32 as thermometer-code based outputs. Based on the output signal of the control circuit 31, the second selector 45 selects the reference voltages which are to be supplied to the comparators that execute the reset operation in such a way that the combination of the reference voltages to be supplied to the comparators which execute the comparison operation always becomes the same. According to the A/D converter, the reset operation based on the reference voltages and the comparison between an analog voltage with the reference voltages are executed in parallel.

As shown in FIG. 10, a semiconductor integrated circuit for a recorded data reproducing apparatus according to the fourth aspect of the invention includes an A/D converter 215 for converting an analog signal to a digital signal, a prestage circuit 232 which provides the A/D converter 215 with an analog signal, an offset voltage canceling circuit 216 and a D/A converter 217, the latter two being provided to cancel an offset voltage which is supplied to the A/D converter 215 from the prestage circuit 232. When the supply of an analog signal to the A/D converter 215 from the prestage circuit 232 is stopped, the offset voltage canceling circuit 216 computes a digital signal for reducing an offset voltage which is to be input to the A/D converter 215 from the prestage circuit 232 based on the output signal of the A/D converter 215. The D/A converter 217 converts the output signal of the offset voltage canceling circuit 216 to an analog voltage signal and sends this signal to the prestage circuit 232. As a result, the offset voltage is eliminated from the output of the prestage circuit 232.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 11:
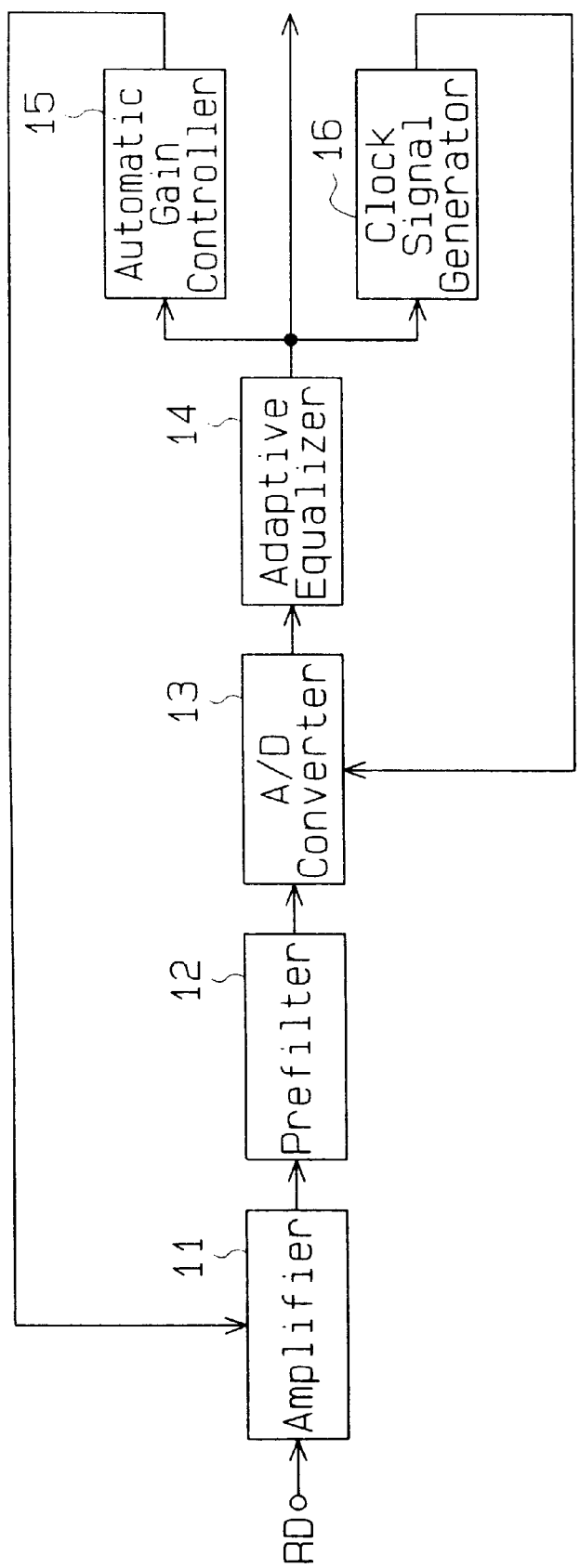
FIG. 11 is a block circuit diagram of a signal processing apparatus to which the invention is adapted.

FIG. 11 illustrates a signal processor which implements an A/D converter in accordance with an embodiment of the present invention and which reads data from a hard disk apparatus.

A read signal RD obtained from a hard disk via a reading head is input as an analog signal to an amplifier 11. The amplifier 11 then amplifies the read signal RD and supplies the amplified signal to a pre-filter 12. The pre-filter 12 consists of a low-pass filter which eliminates unnecessary high-frequency signal components such as noise from the output signal of the amplifier 11. The amplified read signal RD is supplied to an A/D converter 13 through the pre-filter 12.

The A/D converter 13 converts an analog input signal to a digital signal and sends the digital signal to an adaptive equalizer 14. Then, the adaptive equalizer 14 supplies the digital signal from the A/D converter 13 to a decoder (not shown for ease of illustration) at the subsequent stage. The output signal of the adaptive equalizer 14 is also supplied to an automatic gain controller 15 and a clock signal generator 16. Based on the output signal of the adaptive equalizer 14, the automatic gain controller 15 sends a gain control signal to the amplifier 11 to optimize the gain of the amplifier 11. Based on the output signal of the adaptive equalizer 14, the clock signal generator 16 generates a clock signal for a sampling operation in the A/D converter 13.

FIRST EMBODIMENT

Figure 12:
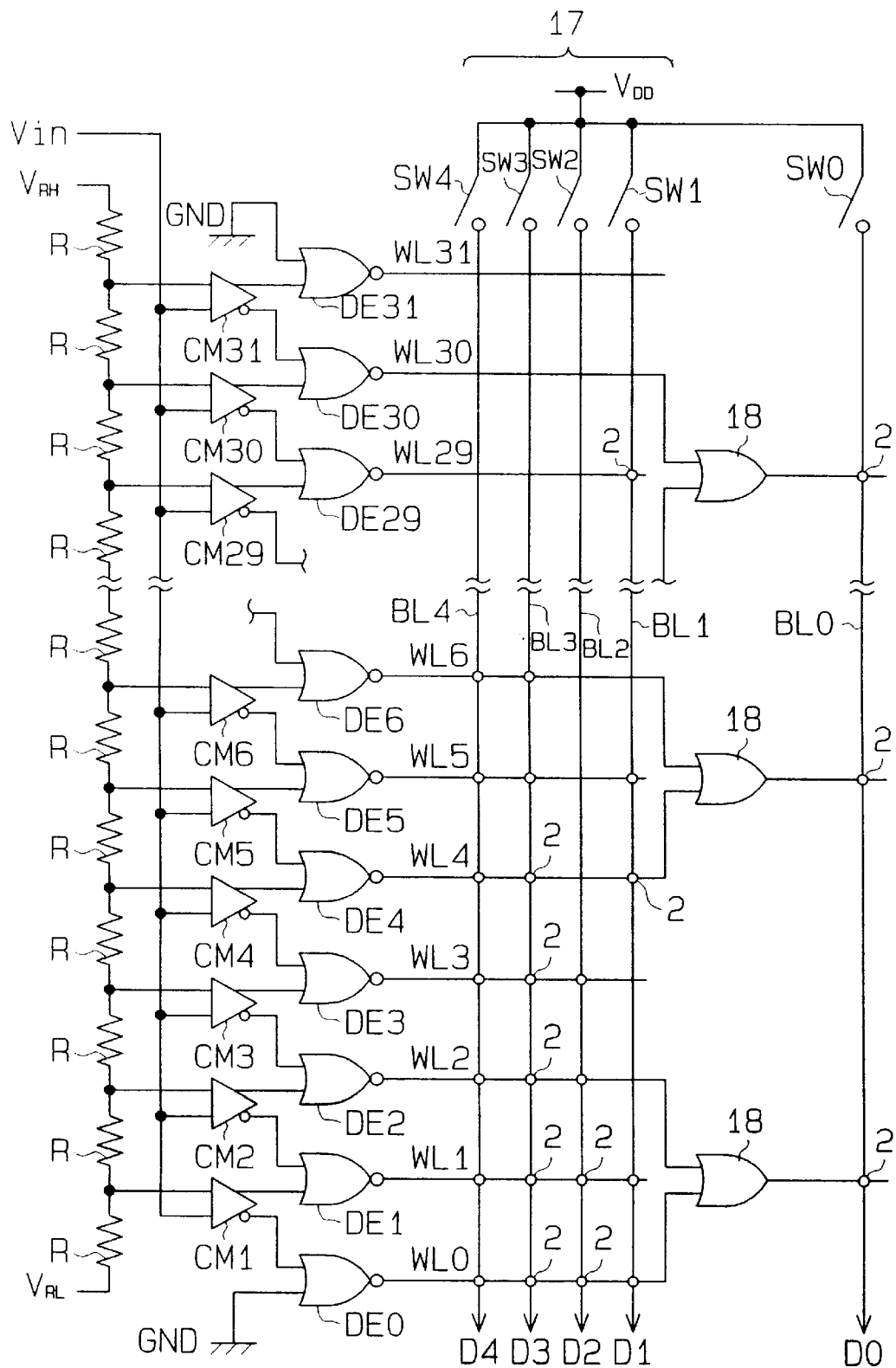
FIG. 12 is a circuit diagram of the first embodiment of the invention.

A parallel type A/D converter according to a first embodiment, which may implement the A/D converter 13 shown in FIG. 11, will now be described with reference to FIG. 12.

The parallel type A/D converter produces 5-bit digital output signals D0 to D4. According to the first embodiment, thirty-two resistors R, are connected in series between a high-potential reference voltage supply $V_{RH}$ and a low-potential reference voltage supply $V_{RL}$. Also shown are thirty-one comparators CM1 to CM31 and thirty-two NOR gates DE0 to DE31, which constitute an address decoder. These comparators CM1 to CM31 and NOR gates DE0 to DE31 have substantially identical structures as conventional structures illustrated in FIG. 1.

Figure 1:
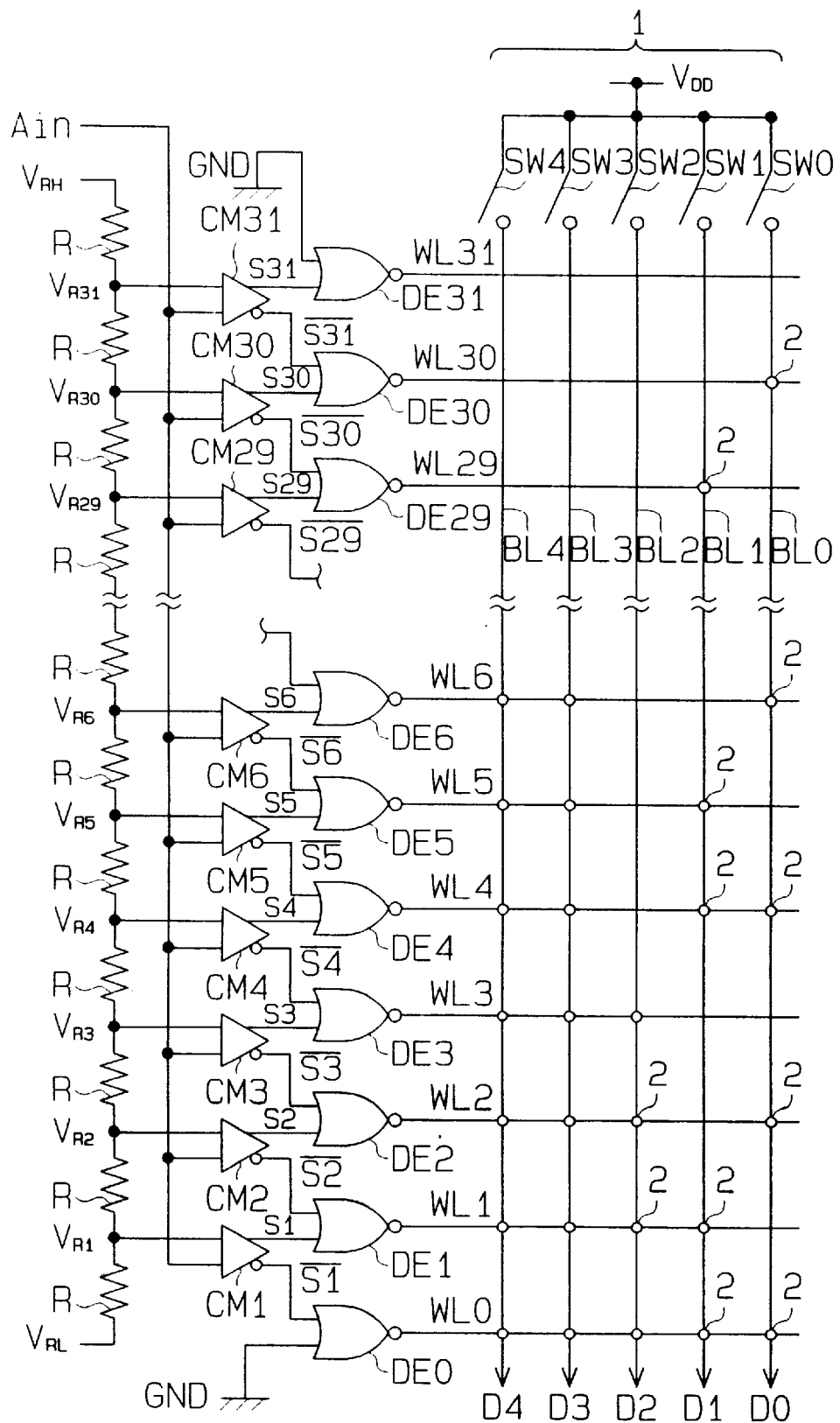
FIG. 1 is a circuit diagram of a first conventional A/D converter.

In an encoder section 17, a plurality of ROM cells 2 are provided between bit lines BL1 to BL4 for outputting digital output signals D1 to D4 and word lines WL0 to WL31 have substantially the same manner as shown in FIG. 1. The encoder section 17 includes eight 2-input OR gates 18 (only three shown for simplicity). Of the thirty-two word lines WL0–WL31, even-numbered word lines including word line WL0 are connected to the aforementioned OR gates 18. The least significant OR gate 18 is connected to a pair of word lines WL0 and WL2, and the most significant OR gate 18 is connected to a pair of word lines WL28 and WL30. The ROM cells 2 are connected between the output terminals of the individual OR gates 18 and the least significant bit line BL0.

When the potential at any one of the word lines connected to the input terminals of the OR gates 18 goes high, the output signal of the OR gates 18 to which that word line is connected goes high. Then, the ROM cell 2 connected to the word line is enabled and the potential at the bit line BL0 goes low. Consequently, the digital output signal D0 to D4 are output from the bit lines BL0 to BL4, in accordance with the output signals of the NOR gates DE0 to DE31.

In this embodiment, the number of the ROM cells 2 connected to the least significant bit line BL0 is half the number required by the first conventional A/D converter. Therefore, the parasitic capacitance of the bit line BL0 becomes smaller than that of the first conventional A/D converter. Since the precharge potential of the least significant bit line BL0 is the most frequently inverted, the reduction of the parasitic capacitance of bit line BL0 therefore significantly contributes to increasing the operation speed of the encoder section 17. As such, the operation speed of the entire A/D converter is improved by the increased operation speed of the encoder section 17. This advantage becomes more pronounced as the number of bits of a digital output signal increases, which requires that the number of ROM cells 2 connected to bit line BL0 be increased.

In the first embodiment, the encoder section 17 is designed to drive the ROM cells 2 connected to bit line BL0 based on OR logic of signals on a pair of word lines. As a result, the number of the ROM cells 2 connected to bit line BL0 is reduced in half. In a varying embodiment, the encoder section 17 may be designed to drive a single ROM cell 2 by way of OR logic having three or more word lines. In this varying embodiment, because the number of ROM cells 2 connected to the least significant bit line BL0 is further reduced, the parasitic capacitance is also further reduced.

With respect to the upper bit lines BL1–BL4 other than the least significant bit line BL0, the encoder section 17 may also be modified to drive ROM cells 2 by way of OR logic as described above.

SECOND EMBODIMENT

Figure 13:
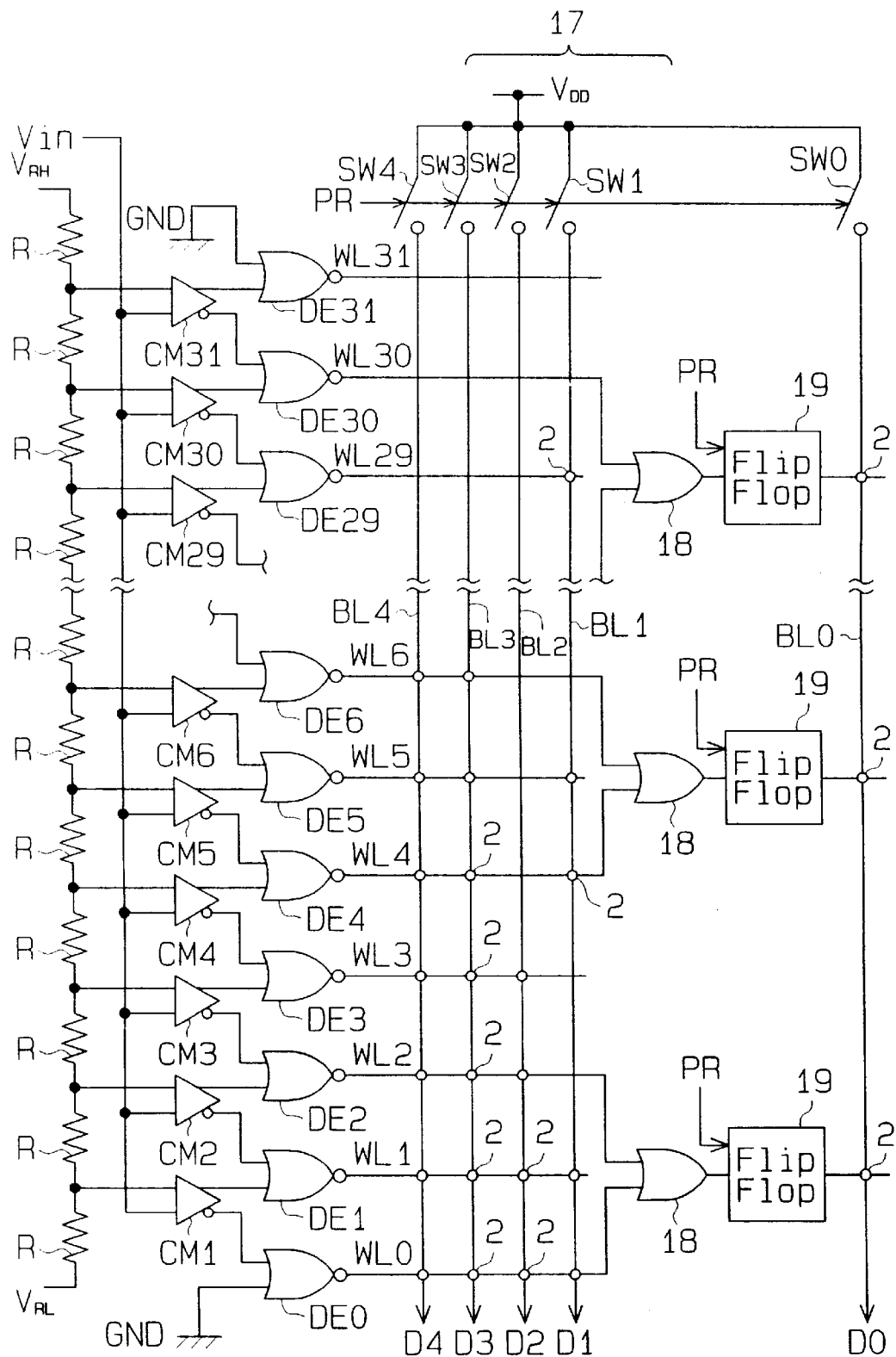
FIG. 13 is a circuit diagram of the second embodiment of the invention.

A parallel type A/D converter in accordance with a second embodiment, which may implement the A/D converter 13 shown in FIG. 11, will now be described with reference to FIG. 13. The second embodiment is substantially the same as the first embodiment except the additional provision of eight flip-flop circuits 19 associated with the eight OR gates 18 in FIG. 12. Each flip-flop circuit 19 receives an output signal from the associated OR gate 18 and a precharge signal PR which is used to control switch circuits SW0 to SW4 for precharging bit lines BL0–BL4. In addition, each flip-flop produces an output signal to drive each of the associated ROM cells 2.

Each flip-flop circuit 19 supplies an H-level output signal to the associated ROM cells 2 when the output signal of the associated OR gate 18 has an H-level. Consequently, the flip-flop circuit 19 functions to latch the output signal of the associated OR gate 18 until it receives the precharge signal PR. Flip-flop circuit 19 continues to latch the OR gate 18 output signals even after all the word lines WL0–WL31 are reset to an L-level and the output signal of the associated OR gate 18 goes low. In addition to the above-described advantages of the first embodiment, the parallel type A/D converter of the second embodiment has an advantage such that an output latch circuit (not shown for ease of illustration) that latches digital output signals D0–D4 can be operated by securing sufficient output time for the digital output signal D0.

THIRD EMBODIMENT

Figure 14:
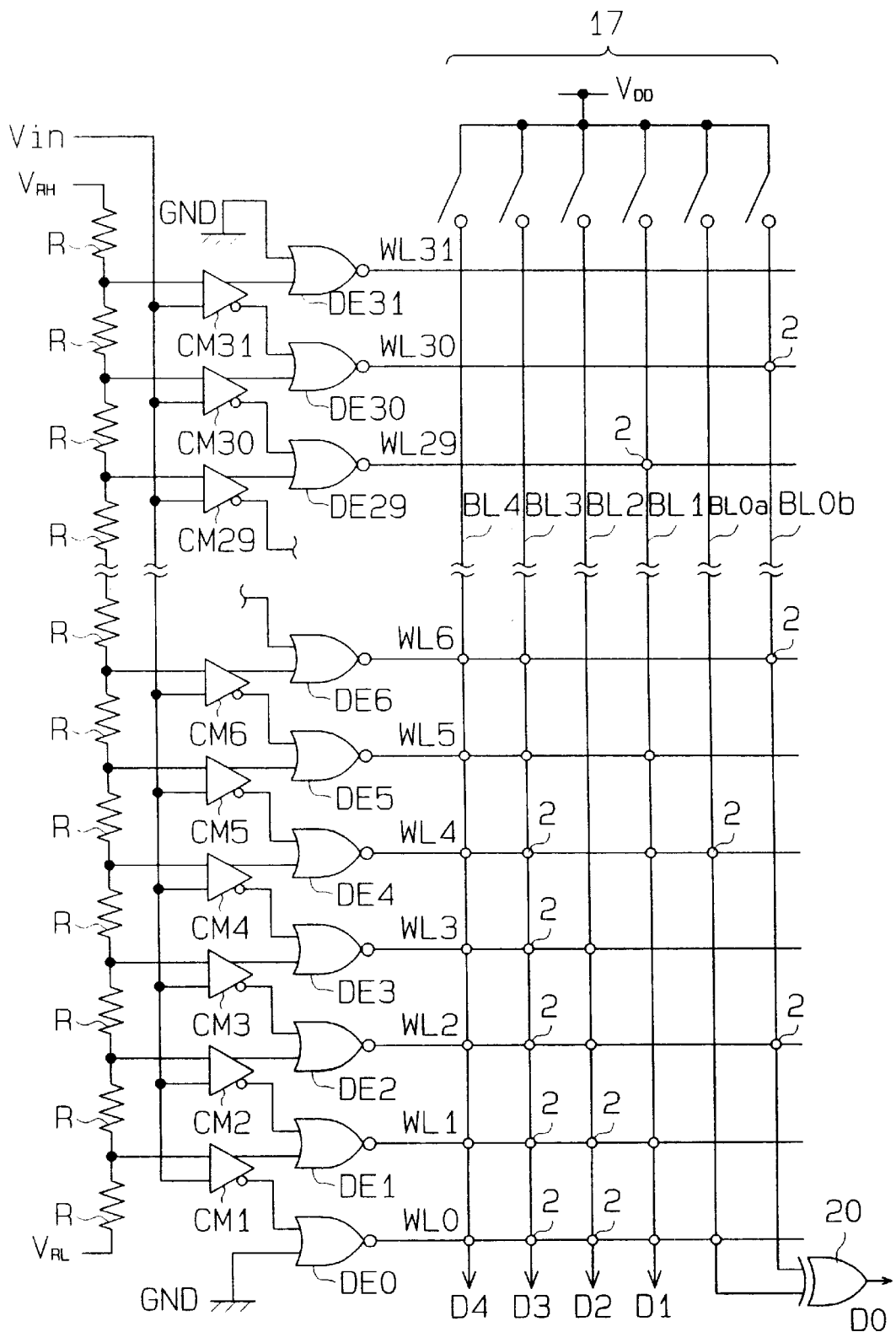
FIG. 14 is a circuit diagram of the third embodiment of the invention.

A parallel type A/D converter in accordance with a third embodiment, which may implement the A/D converter 13 shown in FIG. 11, will now be described with reference to FIG. 14. In the third embodiment, the least significant bit line BL0 consists of two bit lines BL0a and BL0b. For example, a group of ROM cells are alternately connected to the two bit lines BL0a and BL0b.

An encoder section 17 has an exclusive OR (EOR) gate 20 which receives output signals D0a and D0b from the bit lines BL0a and BL0b. The output signal of the EOR gate 20 is output from the encoder section 17 as the least significant digital output signal D0.

This circuit structure, like that of the first embodiment, reduces the number of ROM cells 2 connected to bit lines BL0a and BL0b by half. As a result, the operation speed of encoder section 17 is improved.

When a word line WL0 is selected, for example, the output signal pair (D0a, D0b) of the bit lines BL0a and BL0b become "0, 1" and the output signal D0 of the EOR gate 20 becomes "0". The digital output signals D0–D4 based on the selection of the word line WL0 are produced in this manner. For example, when word line WL1 is selected, the output signal pair (D0a, D0b) of bit lines BL0a and BL0b become "1, 1" and the output signal D0 of the EOR gate 20 becomes "1". Therefore, the digital output signals D0–D4 based on the selection of the word line WL1 are produced in this manner.

FOURTH EMBODIMENT

Figure 15:
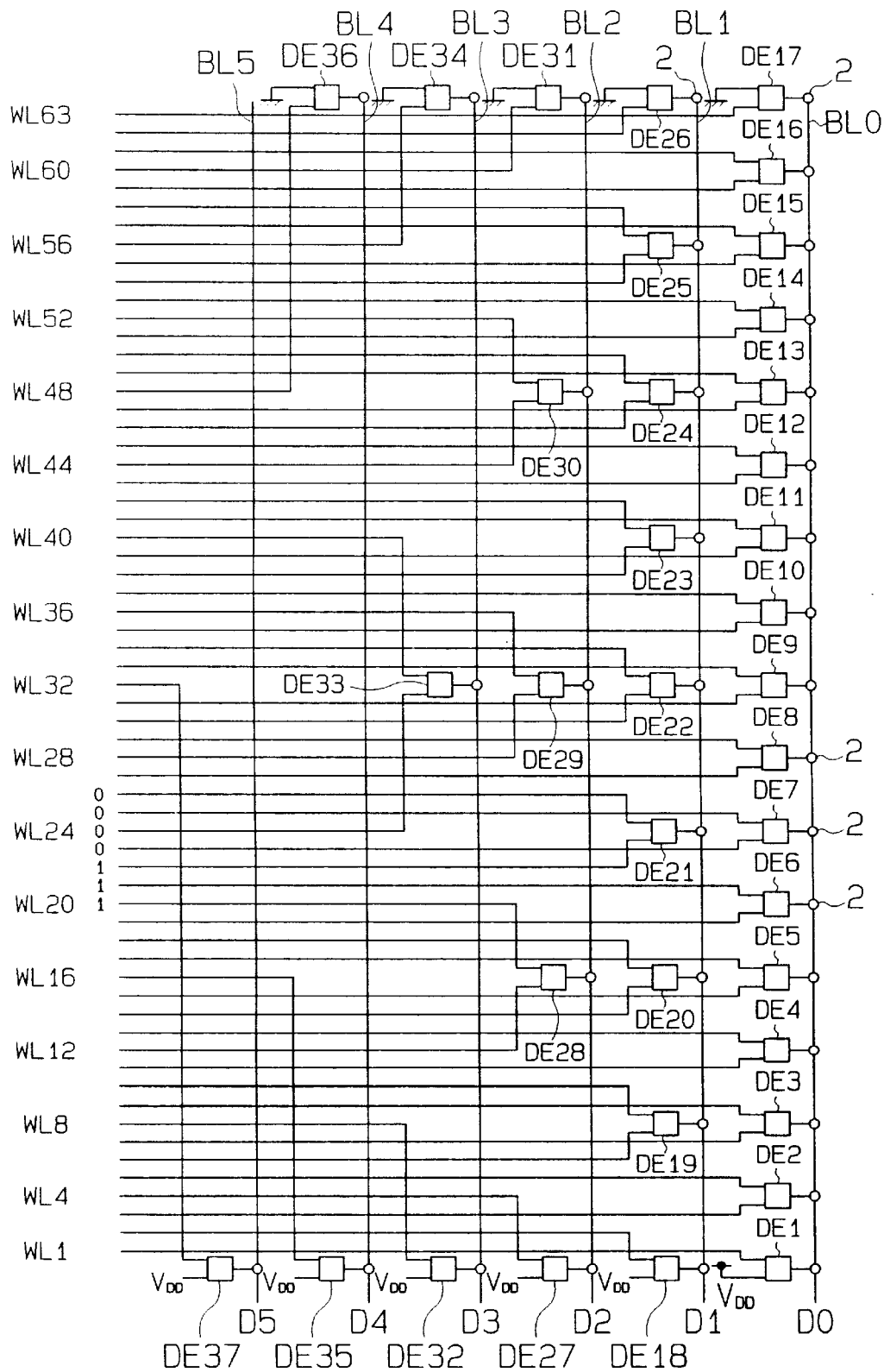
FIG. 15 is a circuit diagram of the fourth embodiment of the invention.

FIG. 15 shows an encoder according to the fourth embodiment that outputs digital output signals D0 to D5 of a gray code, which consist of a total of six bits, based on the output signals from a group of comparators that produce outputs according to a thermometer code.

Thermometer-code based outputs from sixty-three comparators (not shown) are respectively supplied to word lines WL1 to WL63. According to the thermometer code, a group of comparators arranged in series are separated to two groups, and the output signals of the comparators associated to the lower subgroup all become "1" and the output signals of the comparators associated to the upper subgroup all become "0".

Still referring to FIG. 15, six bit lines BL0 to BL5 for outputting digital output signals D0 to D5 consisting of a total of six bits are provided. Seventeen decoders DE1 to DE17 are connected to a least significant bit line BL0. Nine decoders DE18 to DE26 are connected to a bit line BL1. Five decoders DE27 to DE31 are connected to a bit line BL2. Three decoders DE32 to DE34 are connected to a bit line BL3. Two decoders DE35 and DE36 are connected to a bit line BL4. One decoder DE37 is connected to a bit line BL5.

Figure 16:
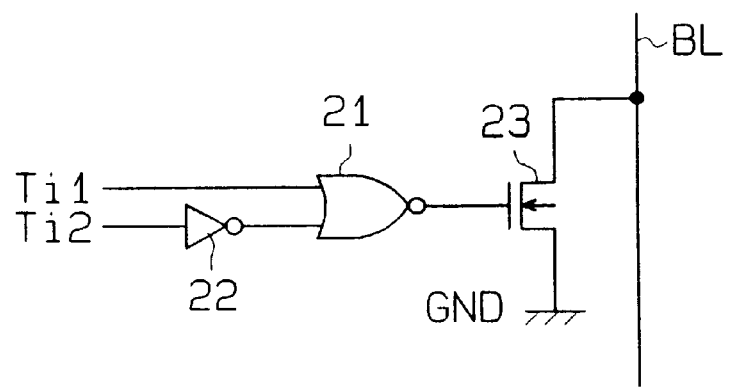
FIG. 16 is a circuit diagram showing an address decoder.

All the decoders DE1–DE37 have the same structure which will be now discussed with reference to FIG. 16. Each decoder has a first and a second input terminal Ti1 and Ti2 respectively, a 2-input NOR gate 21, an inverter circuit 22 and an N channel MOS transistor 23. The first input terminal Ti1 is connected to one input terminal of the NOR gate 21, and the second input terminal Ti2 is connected to the other input terminal of the NOR gate 21 via the inverter circuit 22. The N channel MOS transistor 23 has a gate connected to the output terminal of the NOR gate 21, a drain connected to a bit line BL, and a source connected to ground (GND). The first input terminal Ti1 is connected to a word line which is more significant than the word line to which the second input terminal Ti2 is connected.

In operation, transistor 23 is turned on only when the input terminal Ti1 is set to low and the second input terminal Ti2 is set to high. When both the input terminals Ti1 and Ti2 are set to L-level or H-level, or when the first input terminal Ti1 is set to H-level and the second input terminal Ti2 is set to L-level, transistor 23 is turned off.

In this embodiment, the decoder DE37 associated with the bit line BL5 is connected to the word line WL32 and a power supply $V_{DD}$. The decoder DE36 associated with the bit line BL4 is connected to ground GND and the word line WL48, and the decoder DE32 also associated with the bit line BL4 is connected to the word line WL16 and power supply $V_{DD}$.

The decoder DE34 associated with the bit line BL3 is connected to ground GND and the word line WL56, the decoder DE33 associated with the bit line BL3 is connected to the word lines WL40 and WL24, and the decoder DE32 associated with the bit line BL3 is connected to the word line WL8 and power supply $V_{DD}$.

The decoder DE31 associated with the bit line BL2 is connected to ground GND and word line WL60, the decoders DE30–DE28 associated with the bit line BL2 are respectively connected to every eighth word lines from the word line WL60, and the decoder DE27 associated with the bit line BL2 is connected to the word line WL4 and the power supply $V_{DD}$.

Still referring to FIG. 15, the decoder DE26 associated with the bit line BL1 is connected to ground GND and word line WL62, the decoders DE25–DE19 associated with the bit line BL1 are respectively connected to every fourth word lines from the word line WL62, and the decoder DE18 associated with the bit line BL1 is connected to the word line WL2 and the power supply $V_{DD}$.

The decoder DE17 associated with the bit line BL0 is connected to ground GND and word line WL63, the decoders DE16–DE2 associated with the bit line BL0 are respectively connected to every second word lines from the word line WL63, and the decoder DE1 associated with the bit line BL0 is connected to the word line WL1 and the power supply $V_{DD}$.

The bit lines BL0–BL5 are connected to a precharge circuit (not shown) which precharges bit lines BL0–BL5 for each analog to digital converting cycle.

For illustration purposes, when the thermometer-code based outputs are inverted between the word lines WL22 and WL23 in the above-described structure, the N channel MOS transistor of the decoder DE37 is enabled and the output signal D5 of the bit line BL5 goes low, the N channel MOS transistors of the decoders DE35 and DE36 are disabled and the output signal D4 of the bit line BL4 goes high. Similarly, the N channel MOS transistors of the decoders DE32–E34 are disabled and the output signal D3 of the bit line BL3 goes high, and the N channel MOS transistors of the decoders DE27–DE31 are disabled and the output signal D2 of the bit line BL2 goes high. Finally, the N channel MOS transistor of the decoder DE21 is enabled and the output signal D1 of the bit line BL1 goes low, and the N channel MOS transistors of the decoders DE1–DE17 are disabled and the output signal D0 of the bit line BL0 goes high.

Through this operation, the output signals based on the thermometer code output from a group of comparators are converted to digital output signals D0–D5 of a gray code.

In an alternative embodiment, the number of the decoders connected to respective bit lines BL0–BL5 may be reduced, thus reducing the number of N channel MOS transistors that are connected to bit lines BL0–BL5.

For example, in a conventional encoder, bit line BL5 may be connected to N channel MOS transistors of thirty-one decoders which are used to detect whether the thermometer-code based outputs between adjoining word lines among word lines WL1–WL32 being switched. In contrast, in this embodiment, bit line BL5 is only connected to a single N channel MOS transistor. Likewise, the number of N channel MOS transistors that are connected to each of bit lines BL4–BL1 is reduced. For example, the number of the N channel MOS transistors which are connected to bit line BL0 is reduced from thirty-two (32) to seventeen (17). Therefore, the load capacitances of individual bit lines BL0–BL5 become smaller than those conventionally required. Consequently, the encoding operation becomes faster.

Still referring to FIG. 15, for more significant bit lines, the intervals between word lines connected to a decoder that is associated with that bit line becomes wider. The more significant the bit, the lower the probability that the associated digital output signal is in error. When two or more thermometer-code based outputs from a group of comparators are switched due to errors in the output signals from some comparators, it is likely that the digital output signals from the bit lines will be in error. But, such an error in a thermometer-code based output often occurs in the comparators which are located relatively close to one another. Therefore, the intervals between the word lines connected to a decoder become wider, the digital output signals become less likely to be affected by an error in a thermometer-code based output. In this embodiment, for a more significant bit line, the probability that the digital output signal from that bit line is in error becomes lower.

FIFTH EMBODIMENT

Figure 17:
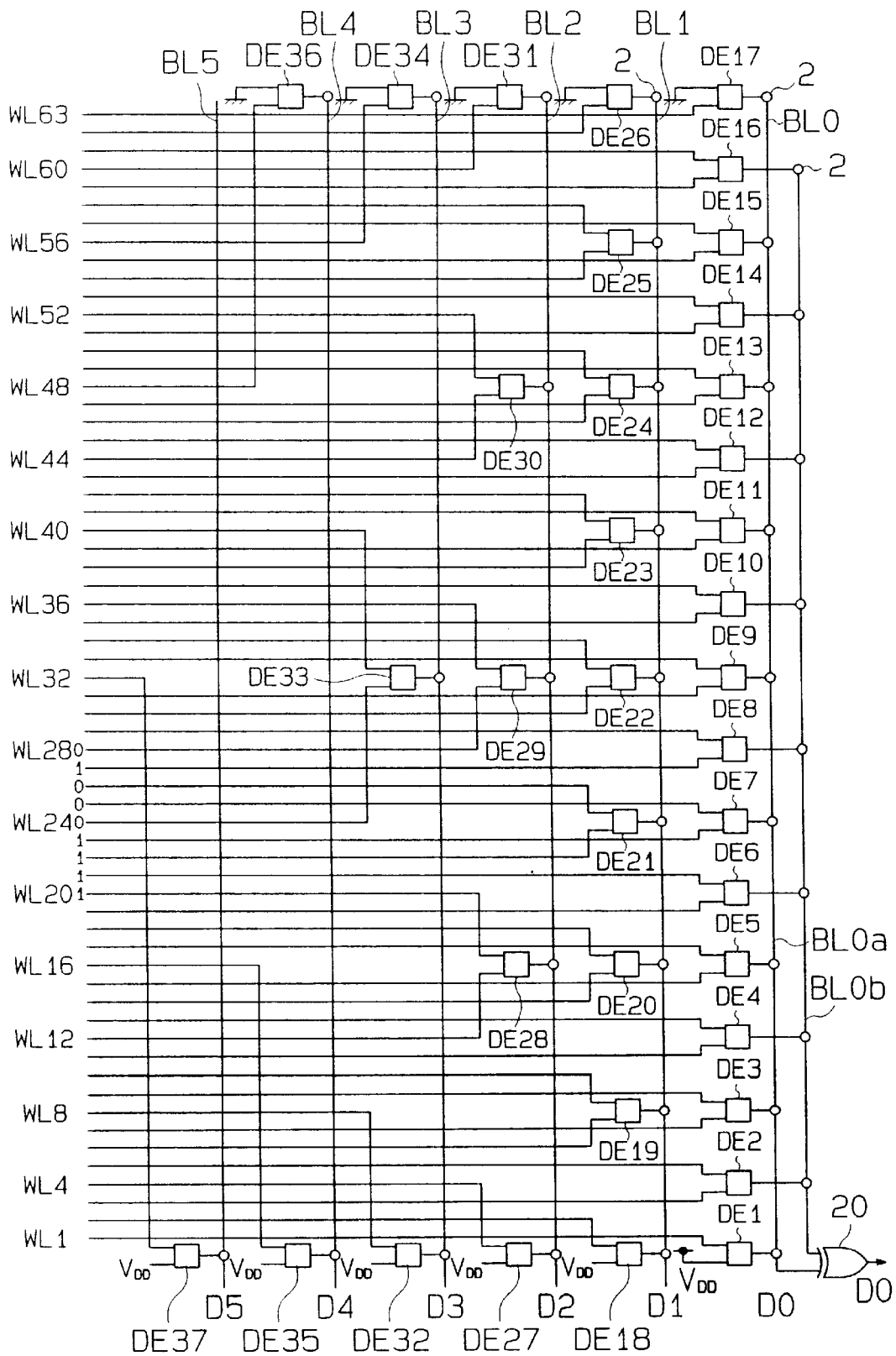
FIG. 17 is a circuit diagram of the fifth embodiment of the invention.

Turning now to FIG. 17, there is shown an encoder according to the fifth embodiment. This encoder outputs digital output signals D0 to D5 of a gray code, which consist of a total of six bits, based on the output signals from a group of comparators which produce thermometer-code based outputs. In the fifth embodiment, the least significant bit line BL0 consists of two bit lines BL0a and BL0b, and a set of decoders DE1–DE17 are alternately connected to the bit lines BL0a and BL0b. Then, bit lines BL0a and BL0b are connected to the input side of an EOR gate 20, which in turn outputs the least significant digital output signal D0.

For illustration purposes, in this circuit structure, when the thermometer-code based outputs are switched between word lines WL23 and WL24 and between word lines WL26 to WL28, as described with respect to FIG. 17, the N channel MOS transistors of the decoders DE7 and DE8 are both turned on such that both bit lines BL0a and BL0b go low. Consequently, the digital output signal D0 from the EOR gate 20 goes high. Based on the digital output signals D1–D5 and on the H-level output signal D0, it is determined that the proper switching of the thermometer-code based outputs occurs in either word line WL25 or WL26. Therefore, even if an error occurs in the thermometer-code based outputs, the digital output signals D0–D5 approximated to the digital output signals according to the correct thermometer-code based outputs can be produced.

In this embodiment, when one of bit lines BL0a and BL0b goes low and the other bit line goes high, the output signal D0 of the EOR gate 20 goes to a L-level which is the proper output level. When the bit lines BL0a and BL0b both go high, output signal D0 of EOR gate 20 goes to a H-level which is the proper output level. In addition to the advantages of the encoder of the fourth embodiment, the encoder of the fifth embodiment therefore has the added advantage that the difference between an error in the digital output signals D0–D5, caused by an error in the thermometer-code based outputs, and the correct digital output signals is reduced.

SIXTH EMBODIMENT

Figure 18:
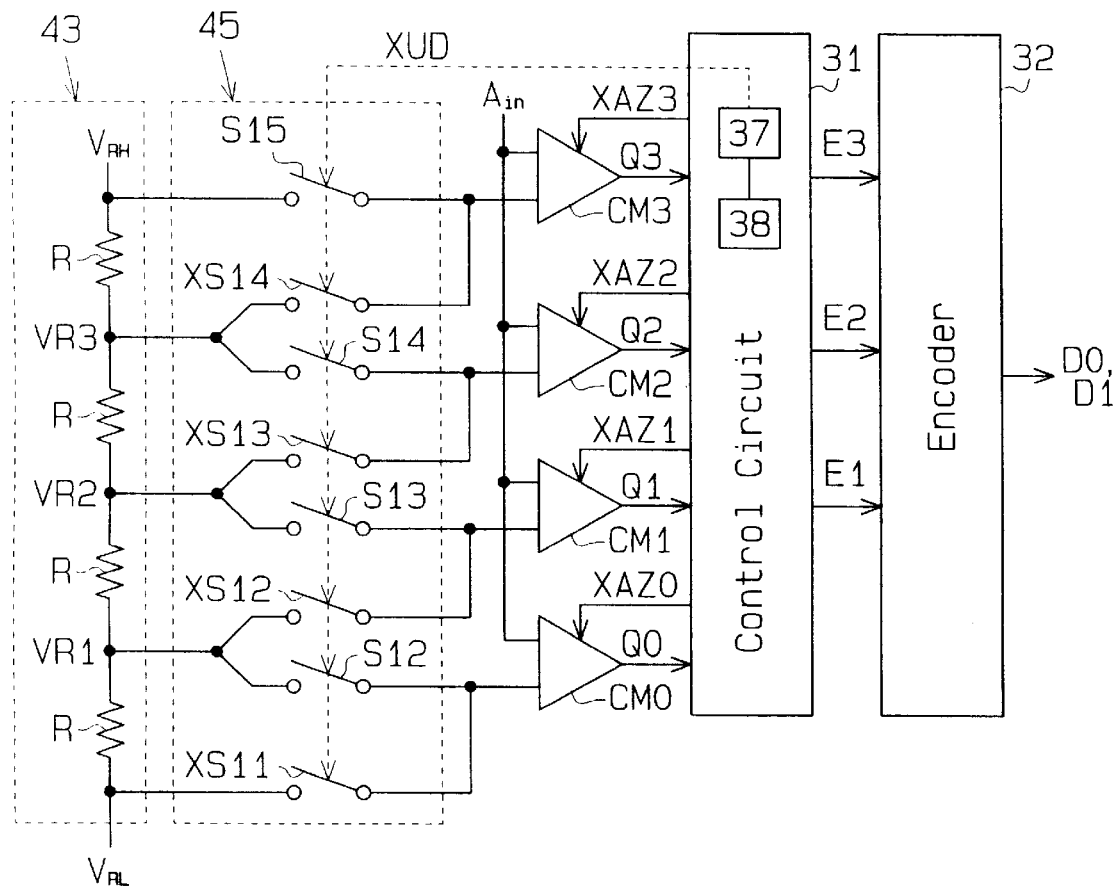
FIG. 18 is a block circuit diagram showing the sixth embodiment of the invention.

FIG. 18 shows an A/D converter modified to use chopper type comparators and speed up the comparison operation of those comparators. This A/D converter adopts "Interleaved auto-zeroing"(IAZ) architecture.

Four resistors R are connected in series between a high-potential reference voltage supply $V_{RH}$ and a low-potential reference voltage supply $V_{RL}$. The resistances of the uppermost and lowermost resistors R in the series resistor circuit are both set to a half of the resistance of each of the remaining resistors. Reference voltages $V_{R1}$, $V_{R2}$ and $V_{R3}$ at three nodes among the four resistors are determined by dividing the potential difference between the high and low reference voltages $V_{RH}$ and $V_{RL}$ by the resistors. Those series-connected four resistors R constitute a reference voltage generator 43.

This A/D converter includes four comparators CM0 to CM3 each having first and second input terminals. Each of the comparators CM0–CM3 receives an analog input signal $A_{in}$ at the first input terminal. The second input terminal of the comparator CM0 is supplied with the low-potential reference voltage $V_{RL}$ via a switch circuit XS11 and the reference voltage $V_{R1}$ via a switch circuit S12.

The second input terminal of the comparator CM1 is supplied with the reference voltage $V_{R1}$ via a switch circuit XS12 and the reference voltage $V_{R2}$ via a switch circuit S13. The second input terminal of the comparator CM2 is supplied with the reference voltage $V_{R2}$ via a switch circuit XS13 and the reference voltage $V_{R3}$ via a switch circuit S14. The second input terminal of the comparator CM3 is supplied with the reference voltage $V_{R3}$ via a switch circuit XS14 and the high-potential reference voltage $V_{RH}$ via a switch circuit S15.

The switch circuits XS11–XS14 and S12–S15 are controlled based on a control signal XUD output from a control circuit 31. More specifically, when the control signal XUD goes low, the switch circuits S12 to S15 are turned on and the switch circuits XS11–XS14 are turned off. When the control signal XUD goes high, on the other hand, the switch circuits S12 to S15 are turned off and the switch circuits XS11–XS14 are turned on. Those switch circuits XS11–XS14 and S12–S15 constitute a selector 45 for selectively distributing a plurality of analog reference voltages, produced by the reference voltage generator 43, to the four comparators CM0–CM3.

Figure 6:
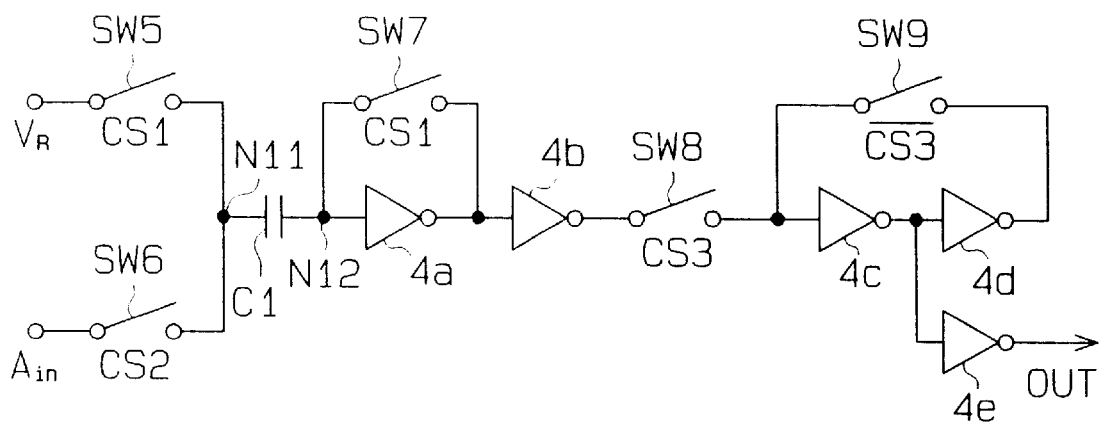
FIG. 6 is a circuit diagram showing a comparator in the second conventional art.
Figure 7:
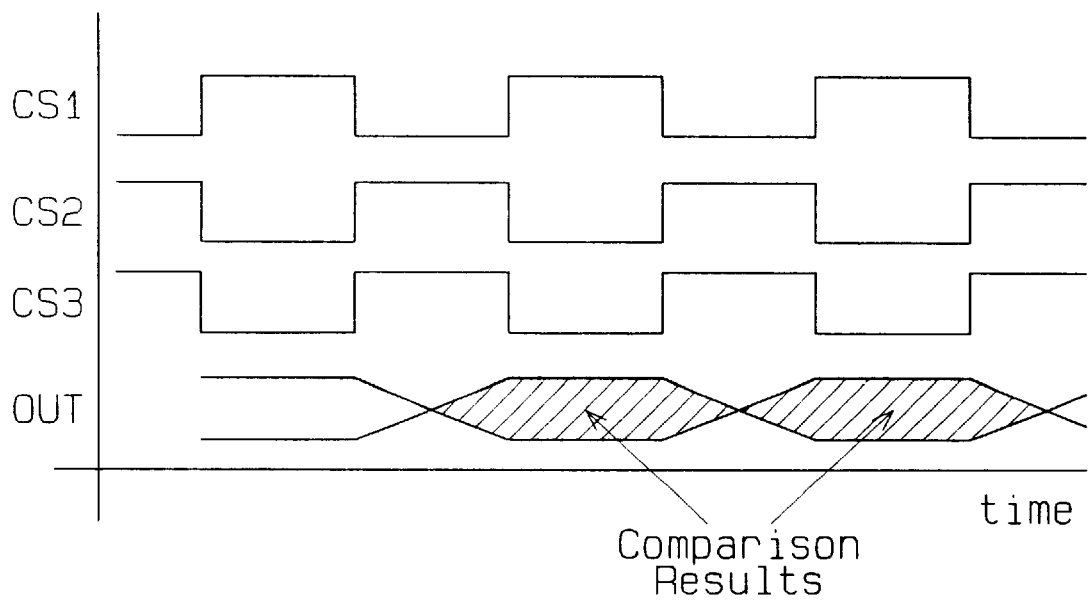
FIG. 7 is a waveform diagram illustrating the operation of the comparator in the second conventional art.
Figure 8:
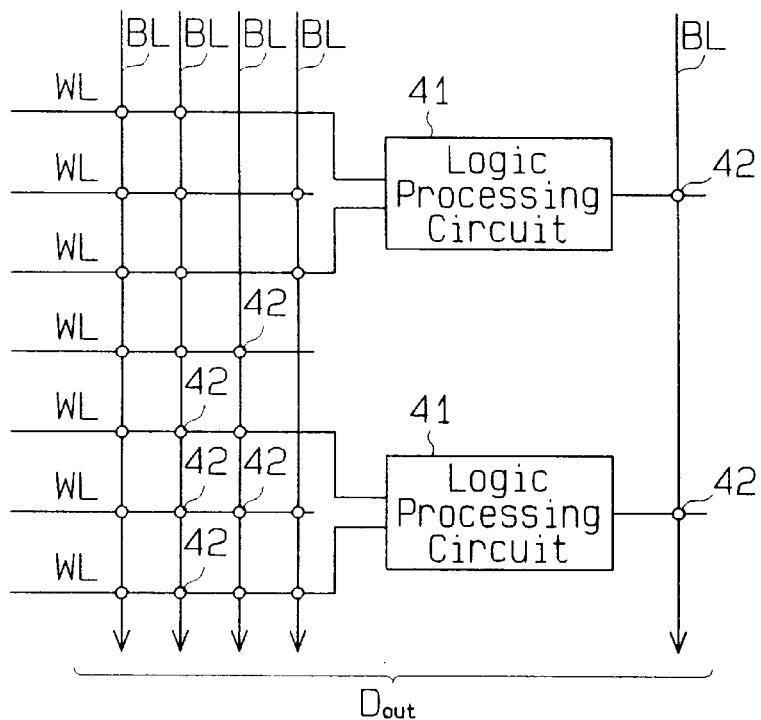
FIG. 8 is a diagram showing the essential parts of an encoder according to the present invention.
Figure 9:
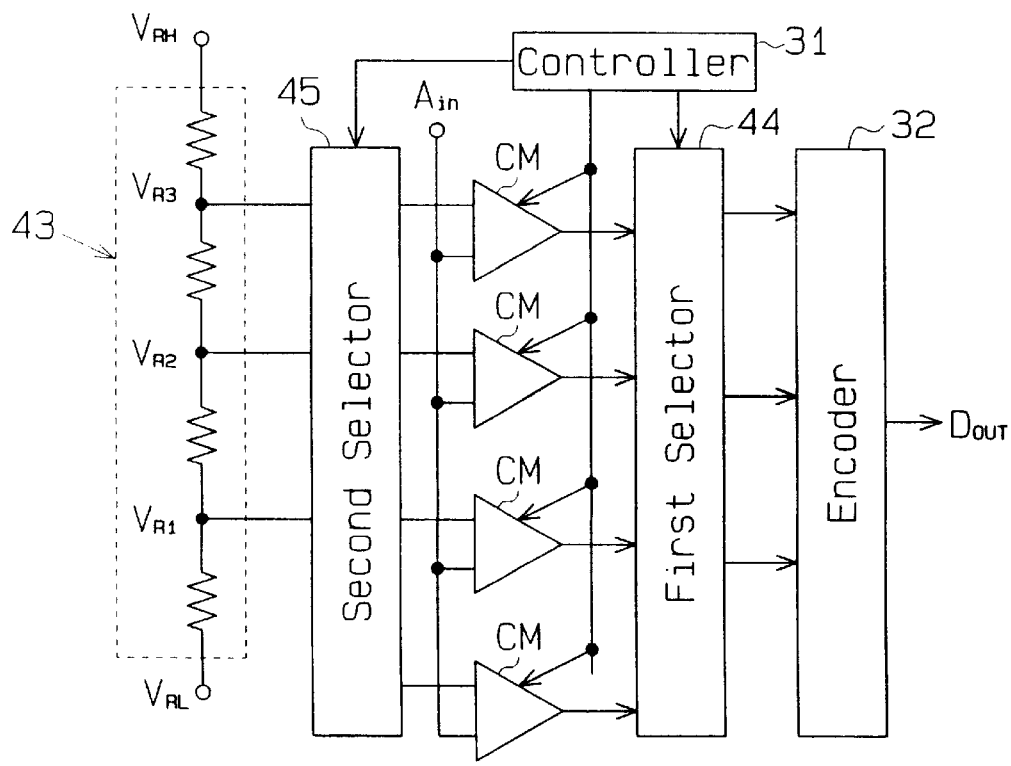
FIG. 9 is a diagram showing the essential parts of an A/D converter according to the invention.
Figure 10:
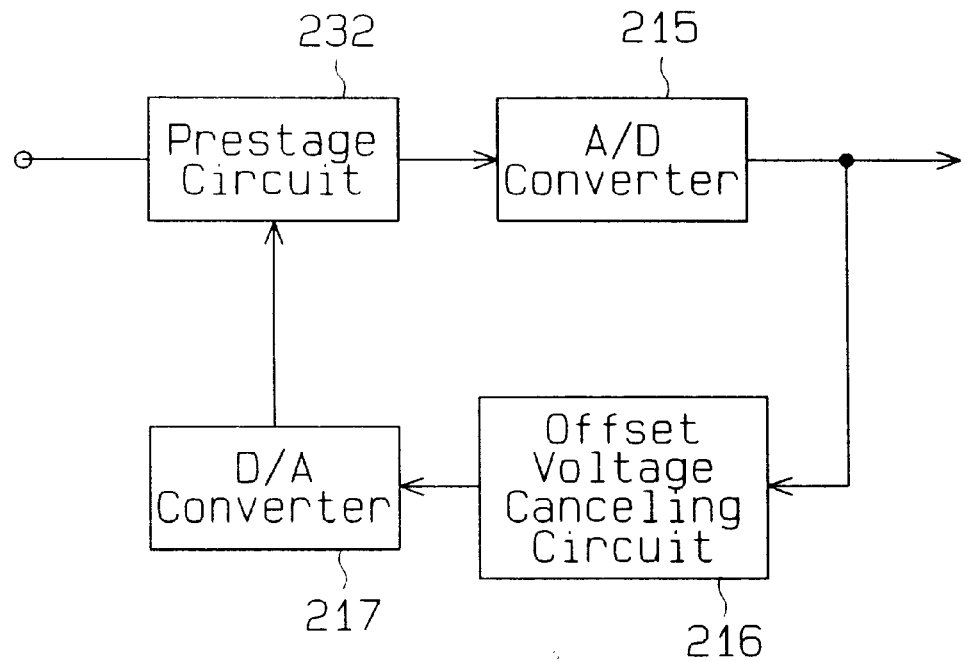
FIG. 10 is a diagram showing the essential parts of a data reproducing apparatus according to the invention.
Figure 19:
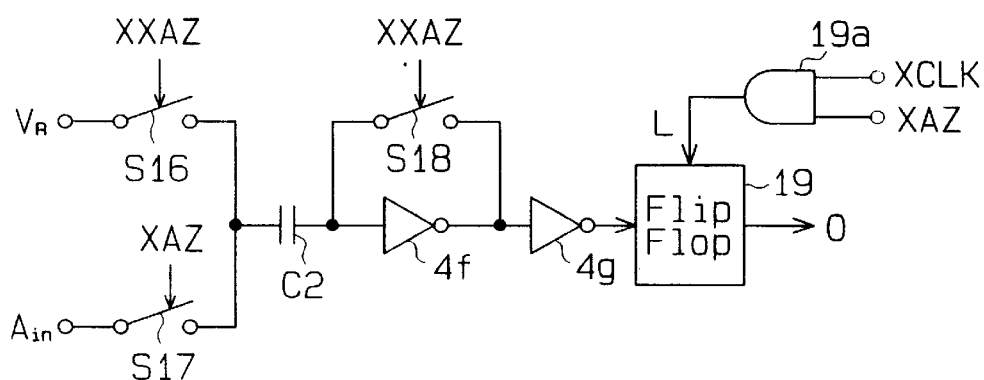
FIG. 19 is a circuit diagram showing a comparator in the sixth embodiment.

Each of the comparators CM0–CM3 is a chopper type. The detailed circuit structure of the comparator CM0 will now be described with reference to FIG. 19. As shown in FIG. 19, the chopper type comparator includes two inverter circuits 4f and 4g, a capacitor C2, three switch circuits S16 to S18, a flip-flop circuit 19 and an AND gate 19a. Each of the inverter circuits 4f and 4g serves as an amplifying unit. This circuit structure is equivalent to the conventional comparator shown in FIG. 6 from which the latch circuit is removed and to which the flip-flop circuit 19 and the AND gate 19a are added. However, the switch circuits S16–S18 are controlled at different timings as those of the corresponding switch circuits of the conventional comparator.

The switch circuit S16 is controlled by a reset signal XXAZ. More specifically, when the reset signal XXAZ goes high, the switch circuit S16 is turned on to apply the reference voltage $V_R$ to the capacitor C2, while when the reset signal XXAZ goes low, the switch circuit S16 is turned off.

The switch circuit S17 is controlled by a reset signal XAZ which is the inverted form of the reset signal XXAZ. More specifically, when the reset signal XAZ goes high, the switch circuit S17 is turned on, while when the reset signal XAZ goes low, the switch circuit S17 is turned off.

The switch circuit S18 is controlled by the reset signal XXAZ. More specifically, when the reset signal XXAZ goes high, the switch circuit S18 is turned on, and when the reset signal XXAZ goes low, the switch circuit S18 is turned off.

The output signal of the inverter circuit 4g is supplied to the flip-flop circuit 19. The AND gate 19a receives a clock signal XCLK, which is the inverted form of a clock signal CLK externally supplied to the control circuit 31, and the reset signal XAZ. The output signal, L, of the AND gate 19a is supplied to the flip-flop circuit 19. The flip-flop circuit 19 latches the output signal of the inverter circuit 4g in response to the falling of the output signal L, and outputs the latched signal as an output signal O.

Figure 20:
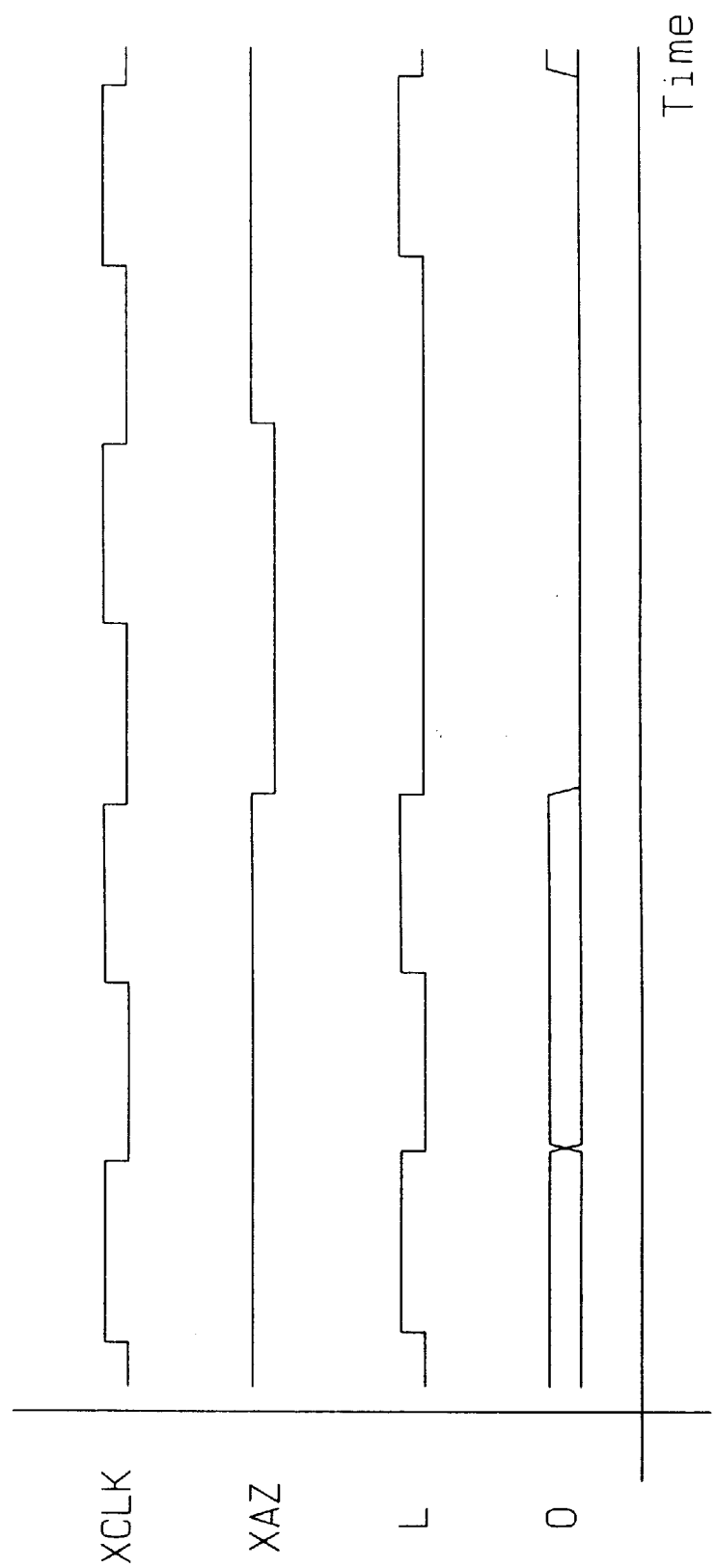
FIG. 20 is a waveform diagram illustrating the operation of the comparator in the sixth embodiment.

When the reset signal XAZ is at an H level as shown in FIG. 20 in this comparator, the switch circuits S16 and S18 are turned off and the switch circuit S17 is turned on so that comparison is performed. Further, the output signal L in phase with the clock signal XCLK is output to the flip-flop circuit 19 from the AND gate 19a. The output signal of the inverter circuit 4g is output from the flip-flop circuit 19 as the output signal O upon each falling of the output signal L.

When the reset signal XAZ goes low, the switch circuits S16 and S18 are turned on and the switch circuit S17 is turned off so that a reset operation is performed. In this case, the output signal L of the AND gate 19a is fixed to an L level, disabling the signal output operation of the flip-flop circuit 19 in response to the falling of the output signal L.

Reset signals XAZO to XAZ3 are respectively supplied to the comparators CM0 to CM3 from the control circuit 31. In response to the reset signals XAZ0–XAZ3 from the control circuit 31, one of the comparators CM0–CM3 is set to the reset mode while the other three comparators are set to the comparison mode. The comparison results from the three comparators are supplied via the control circuit 31 to the encoder 32 as output signals El to E3 according to a thermometer code. The encoder 32 converts the thermometer-code based outputs from the control circuit 31 to two 1-bit digital signals D0 and D1.

Figure 21:
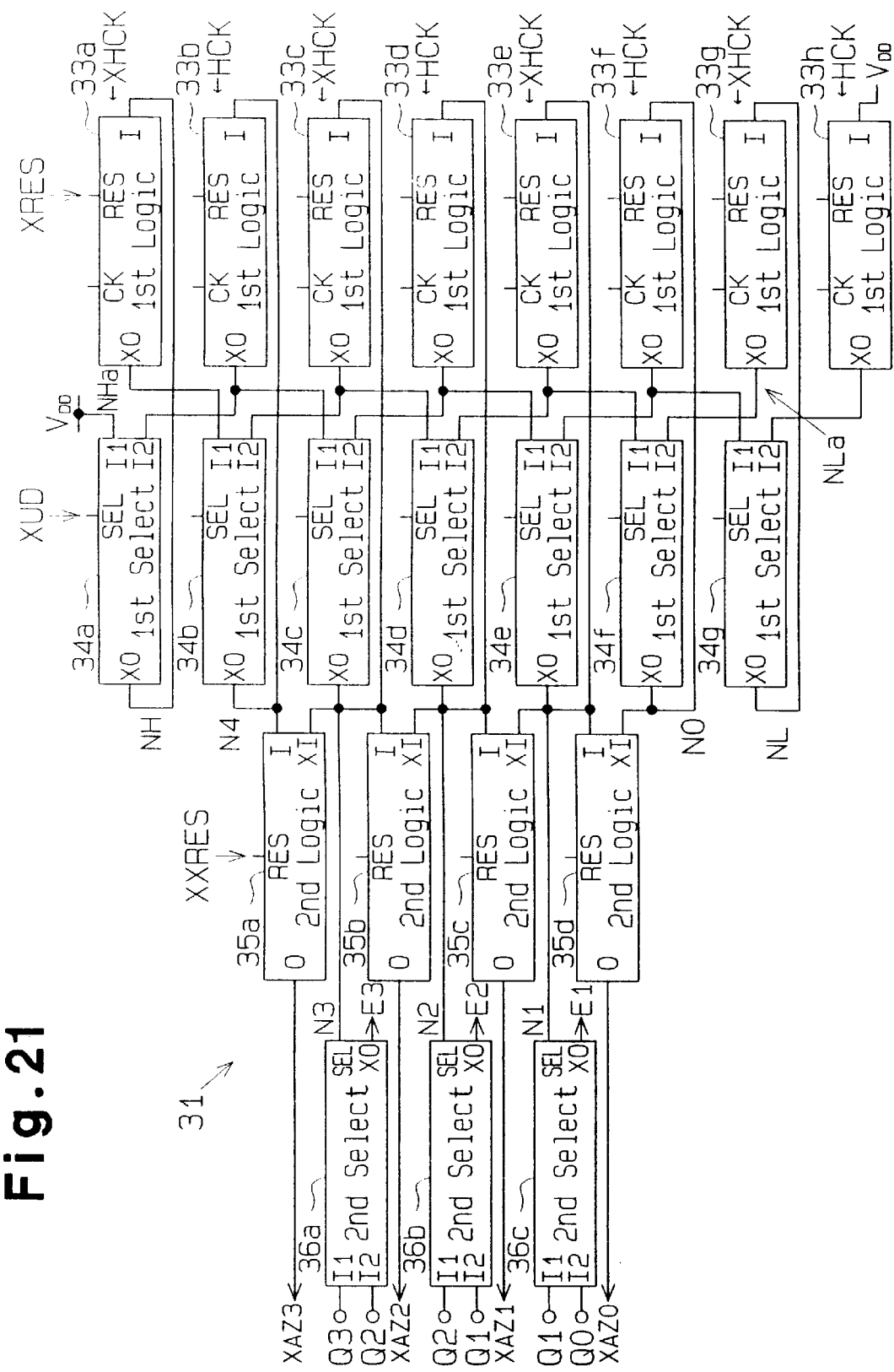
FIG. 21 is a circuit diagram showing a control circuit.

FIG. 21 shows the details of the control circuit 31. The control circuit 31 includes eight first logic blocks 33a to 33h, seven first signal selecting blocks 34a to 34g, four second logic blocks 35a to 35d and three second signal selecting blocks 36a to 36c.

Figure 22:
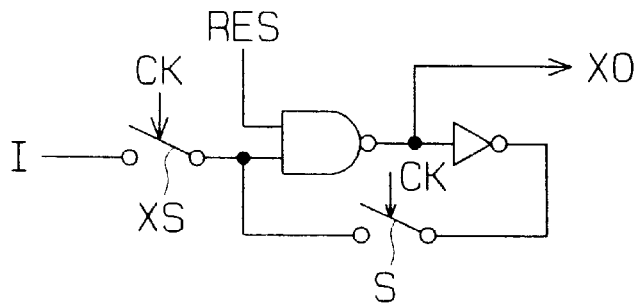
FIG. 22 is a circuit diagram showing a first logic block.

As shown in FIGS. 21 and 22, each of the first logic blocks 33a–33h has an input terminal I, a reset signal input terminal RES, a clock signal input terminal CK and an output terminal XO, and includes a NAND gate, an inverter circuit and two switch circuits S and XS. Those switch circuits S and XS are controlled by a clock signal which is input to the clock signal input terminal CK. When the clock signal CK goes high, the switch circuit S is turned on, and when the clock signal CK goes low, the switch circuit XS is turned on. A reset signal XRES (see FIG. 29) is externally supplied to the reset signal input terminals RES of the first logic blocks 33a–33h.

Input to the clock signal input terminals CK of the first logic blocks 33b, 33d, 33f and 33h is a clock signal HCK which is obtained by dividing the clock signal CLK by 8, which serves to drive the comparators CM0–CM3. Input to the clock signal input terminals CK of the first logic blocks 33a, 33c, 33e and 33g is a clock signal XHCK which is the inverted form of the clock signal HCK.

Figure 23:
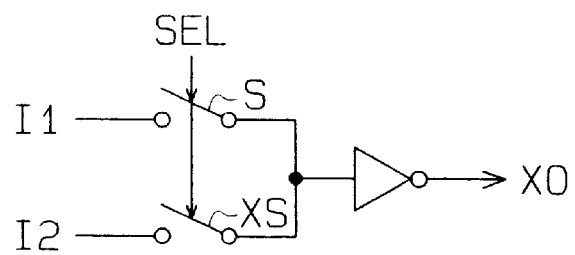
FIG. 23 is a circuit diagram showing a first signal selecting block.

As shown in FIGS. 21 and 23, each of the first signal selecting blocks 34a–34g has two input terminals I1 and I2, a select signal input terminal SEL and an output terminal XO, and includes two switch circuits S and XS and an inverter circuit. The switch circuit S is turned on in response to the H-level select signal SEL and the switch circuit XS is turned on in response to the L-level select signal SEL. In other words, each of the first signal selecting blocks 34a–34g inverts one of the signals input to the input terminals I1 and I2 and outputs the inverted signal from the output terminal XO in response to the select signal SEL.

Figure 24:
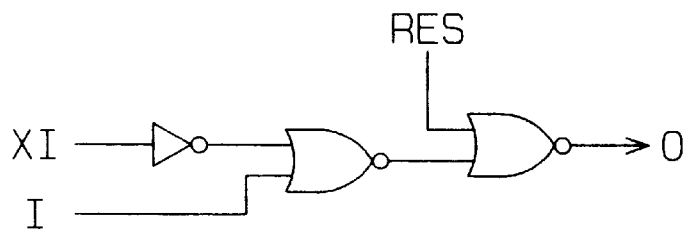
FIG. 24 is a circuit diagram showing a second logic block.

As shown in FIGS. 21 and 24, each of the second logic blocks 35a–35d has two input terminals I and XI, an output terminal O and a reset signal input terminal RES, and includes one inverter circuit and two NOR gates. A signal XXRES which is the inverted form of the reset signal XRES is input to the reset signal input terminal RES of each of the second logic blocks 35a–35d.

Figure 25:
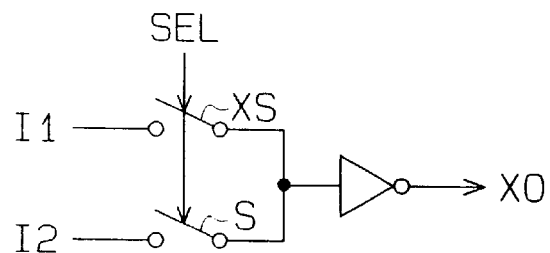
FIG. 25 is a circuit diagram showing a second signal selecting block.

As shown in FIGS. 21 and 25, each of the second signal selecting blocks 36a–36c has two input terminals I1 and I2, a select signal input terminal SEL and an output terminal XO, and includes two switch circuits S and XS and an inverter circuit. The switch circuit S is turned on in response to the H-level select signal SEL and the switch circuit XS is turned on in response to the L-level select signal SEL. In other words, each of the second signal selecting blocks 36a–36c inverts one of the signals input to the input terminals I1 and I2 and outputs the inverted signal from the output terminal XO in response to the select signal SEL.

The output signals Q3 and Q2 of the comparators CM3 and CM2 are respectively input to the input terminals I1 and I2 of the signal selecting block 36a. The output signals Q2 and Q1 of the comparators CM2 and CM1 are respectively input to the input terminals I1 and I2 of the signal selecting block 36b. The output signals Q1 and Q0 of the comparators CM1 and CM0 are respectively input to the input terminals I1 and I2 of the signal selecting block 36c.

Figure 26:
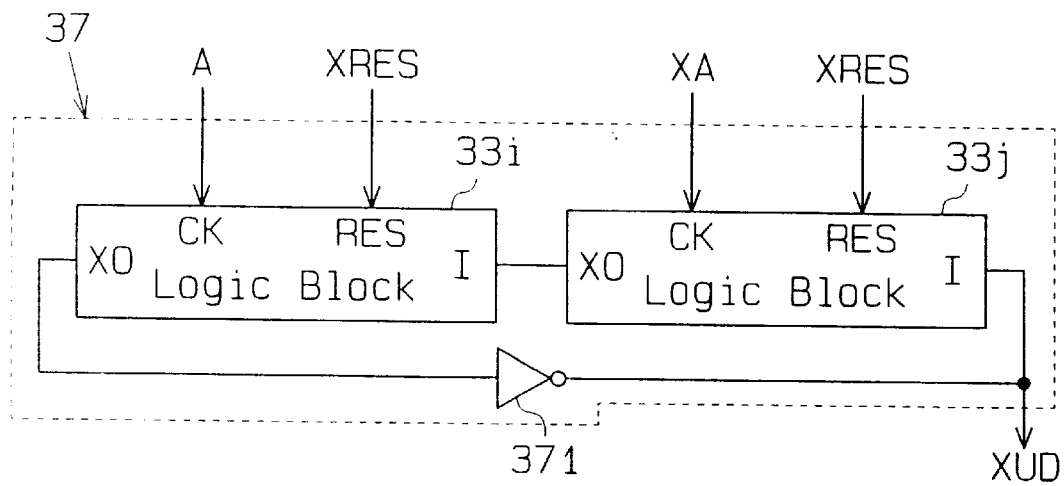
FIG. 26 is a circuit diagram of a signal generator.

FIG. 26 illustrates a signal generator 37, provided in the control circuit 31 to generate the control signal XUD. This signal generator 37 includes an inverter circuit 371, and logic block circuits 33i and 33j, which are of the same type as the first logic block shown in FIG. 22. Those circuits 371, 33i and 33j are connected in loop. The output signal of the inverter circuit 371 is used as the control signal XUD. A control signal A is supplied to the clock signal input terminal CK of the logic block circuit 33i and a control signal XA, which is the inverted form of the control signal A, is supplied to the clock signal input terminal CK of the logic block circuit 33j.

Figure 27:
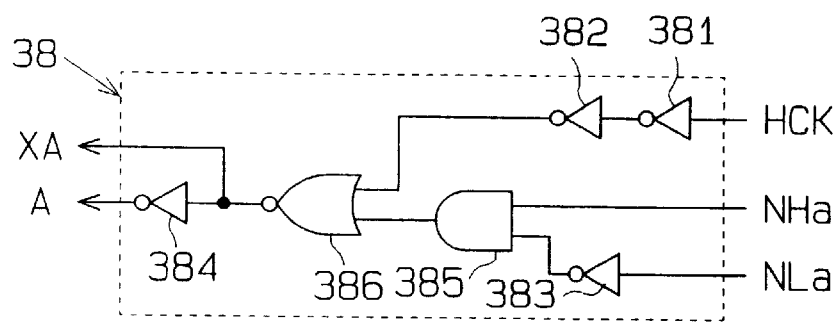
FIG. 27 is a circuit diagram of a signal generator.
Figure 29:
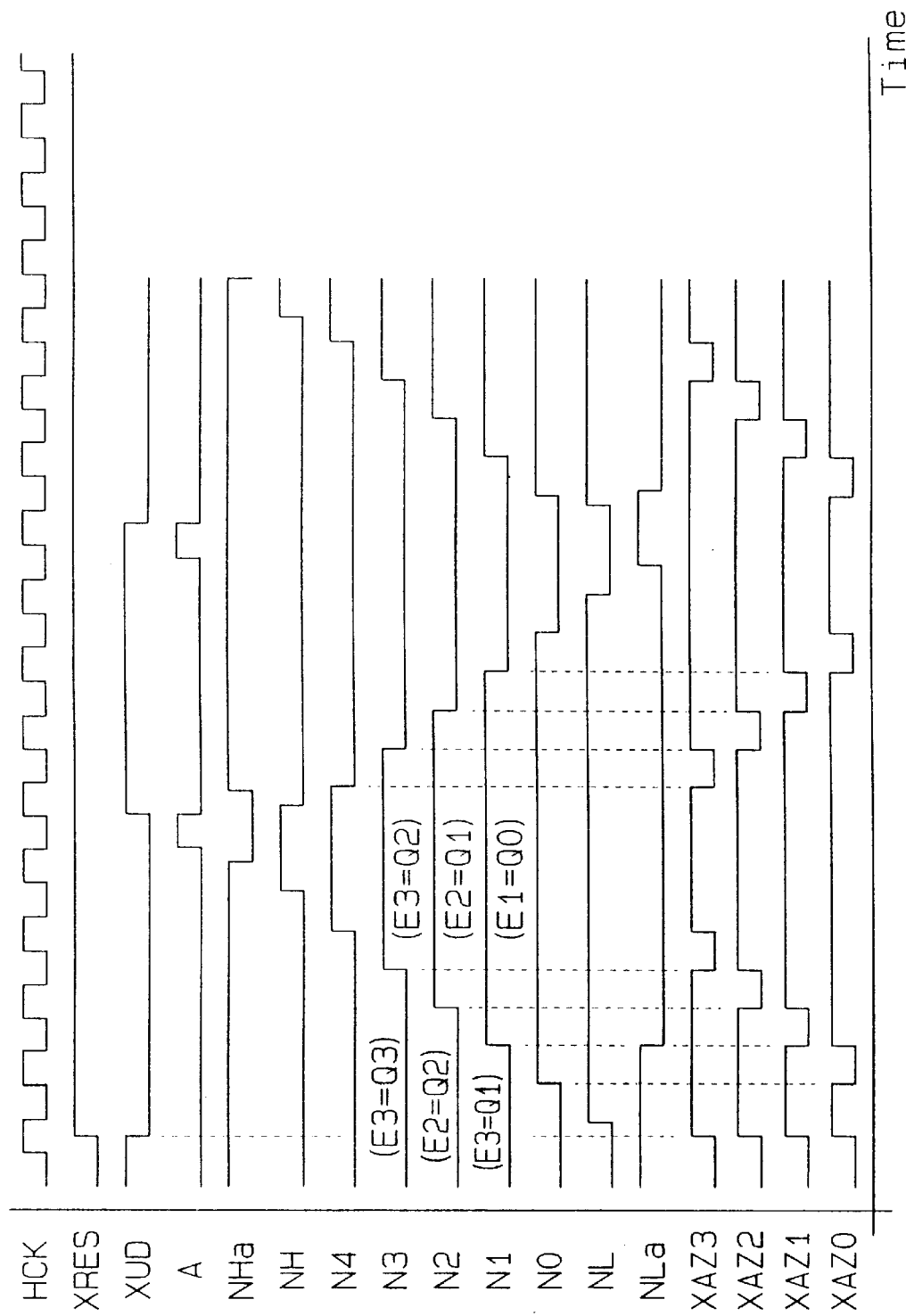
FIG. 29 is a waveform diagram illustrating the operation of the sixth embodiment.

FIG. 27 illustrates a signal generator 38, provided in the control circuit 31 to generate the control signals A and XA. This signal generator 38 receives the aforementioned clock signal HCK, the output signal NHa of the logic block 33a and the output signal NLa of the logic block 33h, as shown in FIG. 29. The signal generator 38 includes four inverter circuits 381 to 384, an AND gate 385 and a NOR gate 386, and generates the control signal A and its inverted control signal XA as shown in FIG. 29. Based on the control signals A and XA and the reset signal XRES, the signal generator 37 shown in FIG. 26 generates the control signal XUD as shown in FIG. 29.

The first and second logic blocks and the first and second signal selecting blocks are connected as shown in FIG. 21. An output signal NH is output to the logic block 33a from the signal selecting block 34a, and an output signal NL is output to the logic block 33g from the signal selecting block 34g. An output signal N0 is output to the logic block 35d from the signal selecting block 34f, and an output signal Ni is output to the logic blocks 35c and 35d and the signal selecting block 36c from the signal selecting block 34e.

An output signal N2 is output to the logic blocks 35b and 35c and the signal selecting block 36b from the signal selecting block 34d. An output signal N3 is output to the logic blocks 35a and 35b and the signal selecting block 36a from the signal selecting block 34c. An output signal N4 is output to the logic block 35a from the signal selecting block 34b. Accordingly, the reset signals XAZ3 to XAZ0 are output from the logic blocks 35a–35d, and the thermometer-code based output signals E3–E1 are output from the signal selecting blocks 36a–36c.

The operation of the A/D converter according to the sixth embodiment will be now discussed with reference to the timing charts illustrated in FIGS. 28 and 29.

At the initial reset mode, the reset signal XRES is set to an L level and the reset signals XAZ0–XAZ3 respectively input to the comparators CM0–CM3 are also set to an L level, as shown in FIG. 29. Further, the control signal XUD is set to an H level, the switch circuits XS11–XS14 are turned on and the switch circuits S12–S15 are turned off. Consequently, the reference voltage $V_{RL}$ is applied to the comparator CM0, the reference voltage $V_{R1}$ is applied to the comparator CM1, the reference voltage $V_{R2}$ is applied to the comparator CM2 and the reference voltage $V_{R3}$ is applied to the comparator CM3.

When the reset signal XRES goes high, the control signal XUD goes low. As a result, the reset signals XAZ–XAZ3 go high so that the comparators CM0–CM3 to which the analog input signal Ain is input start the comparison operation.

Figure 28:
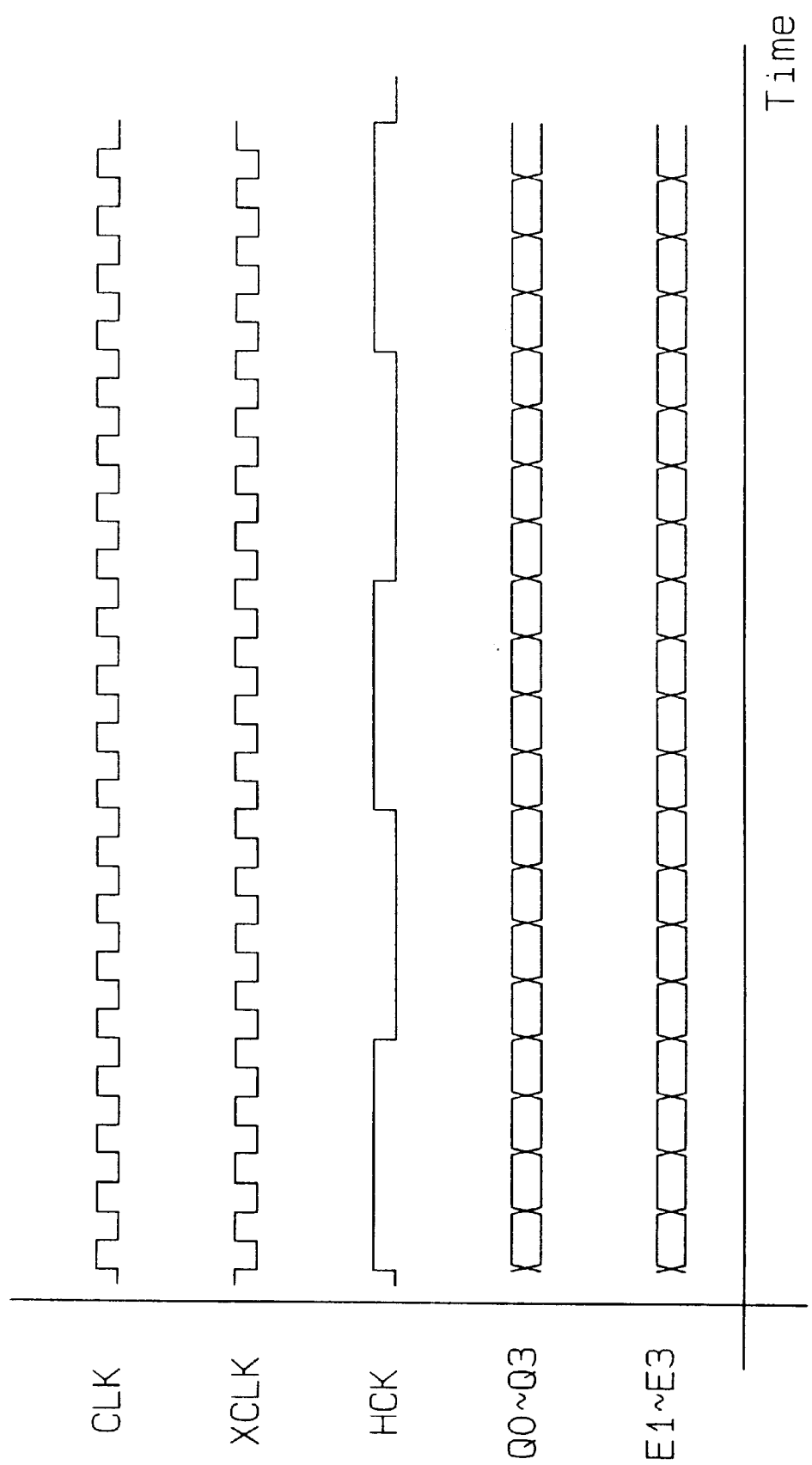
FIG. 28 is a waveform diagram illustrating the operation of the sixth embodiment.

This comparison operation is executed in synchronism with the rising of the clock signal CLK and the comparison results from the comparators CM0–CM3 are output as output signals Q0–Q3, as shown in FIG. 28. At this time, the second signal selecting blocks 36a–36c select three output signals Q1–Q3 from the four output signals Q0–Q3 of the comparators CM0–CM3 in response to the control signals N1, N2 and N3 shown in FIG. 29. The selected output signals Q1–Q3 are used as the thermometer-code based output signals E1–E3.

When the reset signal XAZ0 goes low next, the comparator CM0 initiates the reset operation. Because of the L-level control signal XUD, the comparator CM0 is reset by the reference voltage $V_{R1}$.

When the reset signal XAZ1 goes low next, the comparator CM1 initiates the reset operation. Because of the L-level control signal XUD, the comparator CM1 is reset by the reference voltage $V_{R2}$. Further, the control signal N1 goes high so that the comparator CM0 outputs the output signal Q0 as the output signal E1. Therefore, the comparators CM0, CM2 and CM3 compare the analog input signal Ain with the reference voltages $V_{R1}$ to $V_{R3}$ and output the output signals Q0, Q2 and Q3 indicative of the comparison results as the output signals E1–E3.

When the reset signal XAZ2 goes low next, the comparator CM2 initiates the reset operation. Because of the L-level control signal XUD, the comparator CM2 is reset by the reference voltage $V_{R3}$. Further, the control signal N2 goes high so that the comparator CM1 outputs the output signal Q1 as the output signal E2. Therefore, the comparators CM0, CM1 and CM3 compare the analog input signal $A_{in}$ with the reference voltages $V_{R1}$ to $V_{R3}$ and output the output signals Q0, Q1 and Q3 indicative of the comparison results as the output signals E1–E3.

When the reset signal XAZ3 goes low next, the comparator CM3 initiates the reset operation. Because of the L-level control signal XUD, the comparator CM3 is reset by the reference voltage $V_{RH}$. Further, the control signal N3 goes high so that the comparator CM2 outputs the output signal Q2 as the output signal E3. Therefore, the comparators CM0, CM1 and CM2 compare the analog input signal Ain with the reference voltages $V_{R1}$ to $V_{R3}$ and output the output signals Q0, Q1 and Q2 indicative of the comparison results as the output signals E1–E3.

When the control signal XUD goes high after the execution of A/D conversion under this circumstance, the switch circuits XS11–XS14 are turned on and the switch circuits S12–S15 are turned off. In this situation, the reference voltages to be applied to the comparators CM0–CM3 become the voltages $VR_L$ to $V_{R3}$, respectively.

When the reset signal XAZ3 goes low next, the comparator CM3 initiates the reset operation. Because of the H-level control signal XUD, the comparator CM3 is reset by the reference voltage $V_{R3}$. The comparators CM0, CM1 and CM2 compare the analog input signal Ain with the reference voltages $V_{R1}$ to $V_{R3}$ and output the output signals Q0, Q1 and Q2 indicative of the comparison results as the output signals E1–E3.

When the reset signal XAZ2 goes low next, the comparator CM2 initiates the reset operation. Because of the H-level control signal XUD, the comparator CM2 is reset by the reference voltage $V_{R2}$. Further, the control signal N3 goes low so that the comparator CM3 outputs the output signal Q3 as the output signal E3. Therefore, the comparators CM0, CM1 and CM3 compare the analog input signal Ain with the reference voltages $V_{R1}$ to $V_{R3}$ and output the output signals Q0, Q1 and Q3 indicative of the comparison results as the output signals E1–E3.

When the reset signal XAZ1 goes low next, the comparator CM1 initiates the reset operation. Because of the H-level control signal XUD, the comparator CM1 is reset by the reference voltage $V_{R1}$. Further, the control signal N2 goes low so that the comparator CM2 outputs the output signal Q2 as the output signal E2. Therefore, the comparators CM0, CM2 and CM3 compare the analog input signal Ain with the reference voltages $V_{R1}$ to $V_{R3}$ and output the output signals Q0, Q2 and Q3 indicative of the comparison results as the output signals E1–E3.

When the reset signal XAZ0 goes low next, the comparator CM0 initiates the reset operation. Because of the H-level control signal XUD, the comparator CM1 is reset by the reference voltage $V_{RL}$. Further, the control signal N1 goes low so that the comparator CM1 outputs the output signal Q1 as the output signal E1. Therefore, the comparators CM1, CM2 and CM3 compare the analog input signal Ain with the reference voltages $V_{R1}$ to $V_{R3}$ and output the output signals Q1, Q2 and Q3 indicative of the comparison results as the output signals E1–E3.

As the above-described sequence of operations is repeated, A/D conversion is accomplished.

In the parallel type A/D converter of the sixth embodiment, three comparators which are to perform comparison operations are sequentially selected from the four comparators CM0–CM3 in order to compare the analog input signal Ain with three reference voltages $V_{R1}$–$V_{R3}$ to produce three thermometer-code based output signals E1–E3. The comparator which is not selected undergoes the reset operation. Therefore, no reset operation independent from the comparison operations need not be performed, and the comparison operations are continuously executed at the same time as the reset operation is executed. This improves the speed and precision of the A/D conversion operation.

Since the reset operation can be executed at the same time as the comparison operations, even if a sufficiently long reset time is secured, the time for the comparison operations is not reduced. It is therefore possible to secure a sufficiently long reset time while increasing the operation speed, so that the capacitors of the chopper type comparators can be surely reset to the reference voltages $V_{R1}$–$V_{R3}$. This contributes to improving the precision of A/D conversion.

The sequential resetting of the four comparators CM0–CM3 prevents the occurrence of the operation currents flowing into the comparators CM0–CM3 from the power supply from being concentrated within a short period of time and prevents the occurrence of the charge/discharge currents flowing between the reference voltage nodes and the comparators CM0–CM3 from being concentrated within a short period of time both in the reset mode. It is thus possible to prevent power noise from occurring due to the concentration of the operation currents and prevent the reference voltages from varying due to the concentration of the charge/discharge currents.

Although the number of comparators used in the sixth embodiments is greater by one than the number of the thermometer-code based output signals, comparators greater in number by two or more than the number of the output signals may be used as well.

The IAZ architecture is defined that each comparator in turn is auto-zeroed while the others stay in the comparison state, but as a whole the A/D converter always appears to be in the comparison state.

SEVENTH EMBODIMENT

Figure 2:
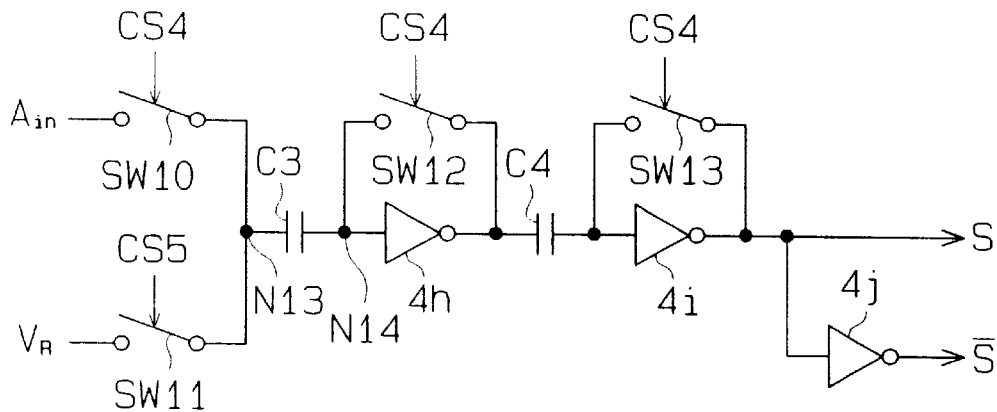
FIG. 2 is a circuit diagram showing a comparator in the first conventional A/D converter.
Figure 3:
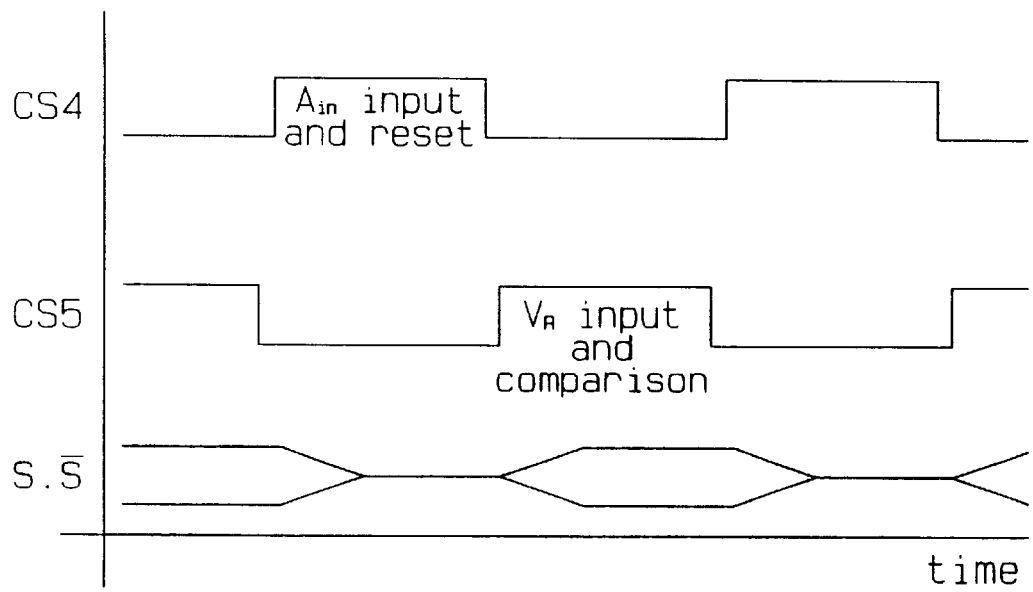
FIG. 3 is a waveform diagram illustrating the operation of the comparator in the first conventional A/D converter.
Figure 4:
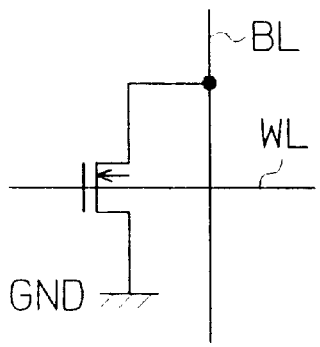
FIG. 4 is a circuit diagram showing a ROM cell in the first conventional A/D converter.
Figure 5:
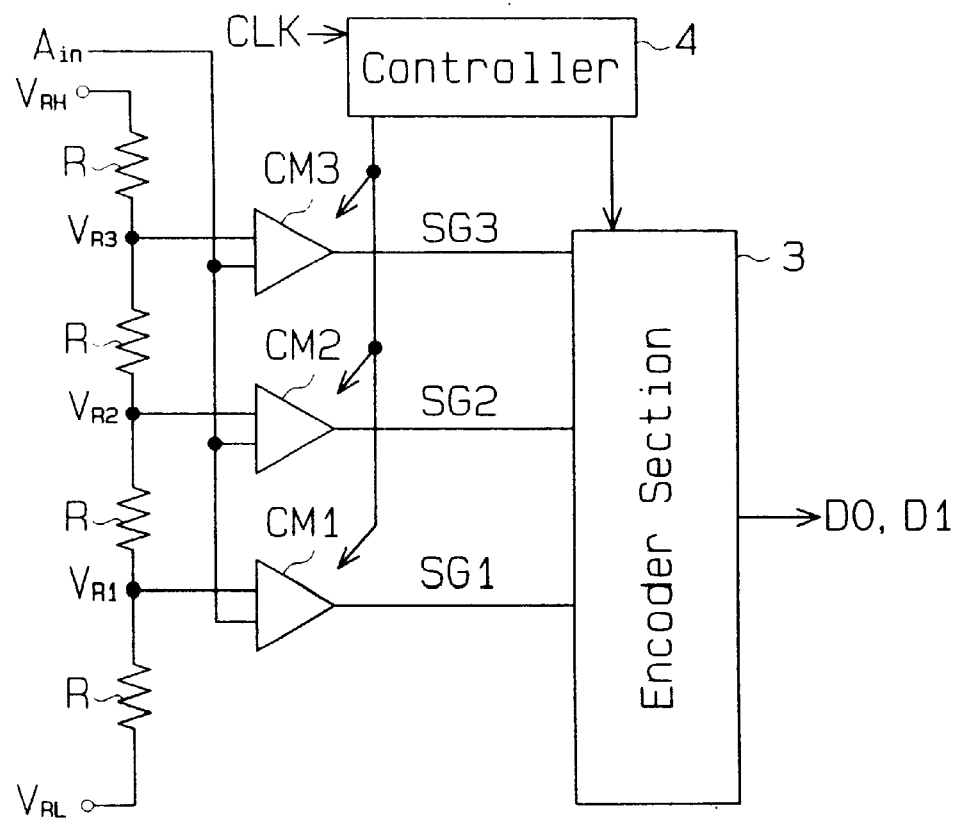
FIG. 5 is a block circuit diagram of a second conventional A/D converter.
Figure 30:
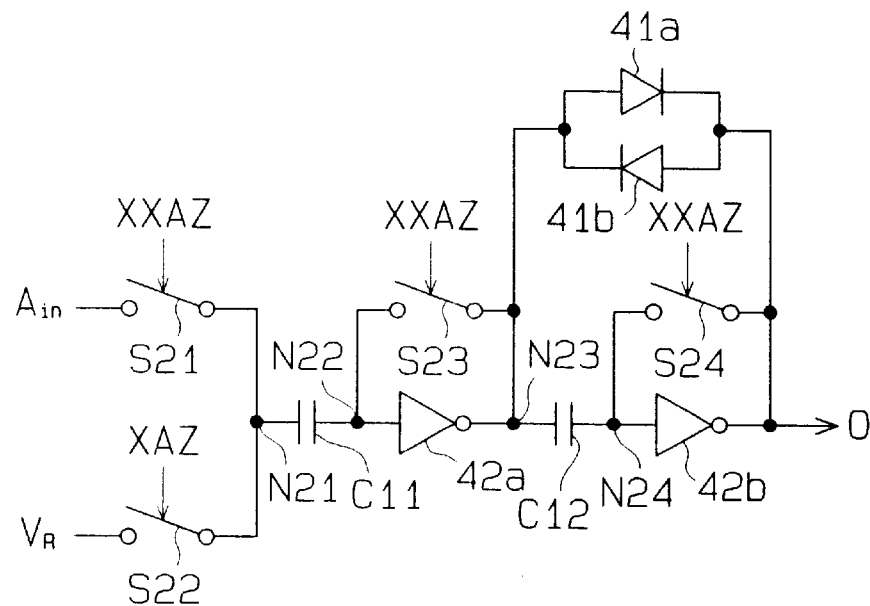
FIG. 30 is a circuit diagram of the seventh embodiment of the invention.

FIG. 30 illustrates a chopper type comparator usable as the one used in the sixth embodiment. The comparator according to the seventh embodiment is equivalent to the conventional comparator shown in FIG. 2 to which two PN junction diodes 41a and 41b are added.

Two input terminals to which the analog input signal Ain and the reference voltage $V_R$ are respectively input are connected via respective switch circuits S21 and S22 to a node N21 as the first end of a capacitor C11. The switch circuits S21 and S22 are controlled based on the control signals XXAZ and XAZ output from the control circuit 31, and are turned on when the control signals XXAZ and XAZ go high.

A node N22 as the second end of the capacitor C11 is connected to the input terminal of an inverter circuit 42a as an amplifying unit. A node N23 as the output terminal of the inverter circuit 42a is connected to the node N22 via a switch circuit S23. The switch circuit S23 is controlled by the control signal XXAZ and is turned on when the control signal XXAZ goes high.

The node N23 is connected, via a capacitor C12, to a node N24 or the input terminal of an inverter circuit 42b as an amplifying unit. The output terminal of the inverter circuit 42b is connected to the node N24 via a switch circuit S24. The switch circuit S24 is controlled by the control signal XXAZ and is turned on when the control signal XXAZ goes high.

A pair of diodes 41a and 41b are connected in the opposite directions between the node N23 and the output terminal of the inverter circuit 42b. The output signal O of the comparator is output from the output terminal of the inverter circuit 42b.

The circuit section between the two input terminals and the inverter circuit 4f in the comparator shown in FIG. 19 may be replaced with the comparator shown in FIG. 30.

The operation of the comparator according to the seventh embodiment will be described below. First, when the control signal XAZ goes low and the control signal XXAZ goes high, the switch circuits S21, S23 and S24 are turned on and the switch circuit S22 is turned off. Consequently, the charge current is supplied to the capacitor C11, causing the potential level at the node N21 to reach the potential level of the analog input signal Ain. The nodes N22 and N23 are reset to the threshold voltage of the inverter circuit 42a, and the node N24 and the output terminal of the inverter circuit 42b are reset to the threshold voltage of the inverter circuit 42b. In this case, the potential difference between the potentials at the node N23 and the output terminal of the inverter circuit 42b becomes smaller than the forward-biased voltage drops of the diodes 41a and 41b, so that the diodes 41a and 41b are enabled.

When the control signal XXAZ goes low and the control signal XAZ goes high, the switch circuits S21, S23 and S24 are turned off and the switch circuit S22 is turned on. Consequently, the reference voltage $V_R$ is compared with the analog input signal Ain. When the reference voltage $V_R$ is higher than the potential of the analog input signal Ain, the potential at the node N22 becomes higher than the threshold voltage of the inverter circuit 42a due to the capacitive coupling by the capacitor C11, causing the node N23 to be set low.

When the node N23 goes low, the potential at the node N24 becomes lower than the threshold voltage of the inverter circuit 42b due to the capacitive coupling by the capacitor C12. Consequently, the output signal O goes high.

When the reference voltage $V_R$ is lower than the potential of the analog input signal Ain, the levels of the aforementioned signals are inverted. When the potential difference between the potential at the node N23 and the potential of the output signal O, which has the inverted level of the level of the potential at the node N23, exceeds the forward-biased voltage drop of the diodes 41a and 41b, one of those diodes 41a and 41b is turned on.

The potential difference between the potential of the output signal O and the potential at the node N23 is set to about the forward-biased voltage drop of the diodes 41a and 41b or about 0.6 V, with the result that the amplitude of the output signal O is suppressed to around 0.6 V. Thus, the diodes 41a and 41b serve as a circuit for suppressing the amplitude of the output signal of an amplifying unit.

When the control signal XXAZ goes high and the control signal XAZ goes low again, the node N21 is reset to the potential level of the analog input signal Ain, the nodes N22 and N23 are reset to the threshold voltage of the inverter circuit 42a, and the node N24 and the output terminal of the inverter circuit 42b are reset to the threshold voltage of the inverter circuit 42b.

This reset operation is completed promptly because it is executed with the amplitudes of the signal at the node N23 and the output signal O being suppressed by the diodes 41a and 41b. When the levels of the control signals XXAZ and XAZ are inverted, the reference voltage $V_R$ and the potential of the analog input signal Ain are again compared with each other. Then, the above-described sequence of operations is repeated.

According to the comparator of the seventh embodiment, the negative feedback loop formed by the diodes 41a and 41b suppresses the amplitude of the output signal O when the reference voltage $V_R$ is compared with the analog input signal Ain. The reset operation following this comparison is therefore speeded up. This allows the frequencies of the control signals XXAZ and XAZ to be increased, which results in faster A/D conversion.

One of the P channel MOS transistor and N channel MOS transistor, which constitute an inverter in each inverter circuit 42a or 42b may be replaced with a resistor element. The gate voltage of one of the transistors may be set constant, so that a constant current flow through that transistor.

In the case where a greater number of stages of inverter circuits than those of the seventh embodiment are connected in series by the capacitive coupling to constitute a chopper type comparator, a pair of diodes 41a and 41b may be provided not only between the output terminals of the inverter circuit at the last stage and the inverter circuit at the previous stage but also between the output terminals of the inverter circuits at the two further previous stages.

Those diodes 41a and 41b may be connected between the input terminals of a series of inverter circuits.

Further, the amplitude of the output signal O of the inverter circuit 42b may be suppressed by removing the capacitor C12 between the inverter circuits 42a and 42b to directly connect those inverter circuits 42a and 42b and by providing the diodes 41a and 41b between the input and output terminals of the inverter circuit 42b.

EIGHTH EMBODIMENT

Figure 31:
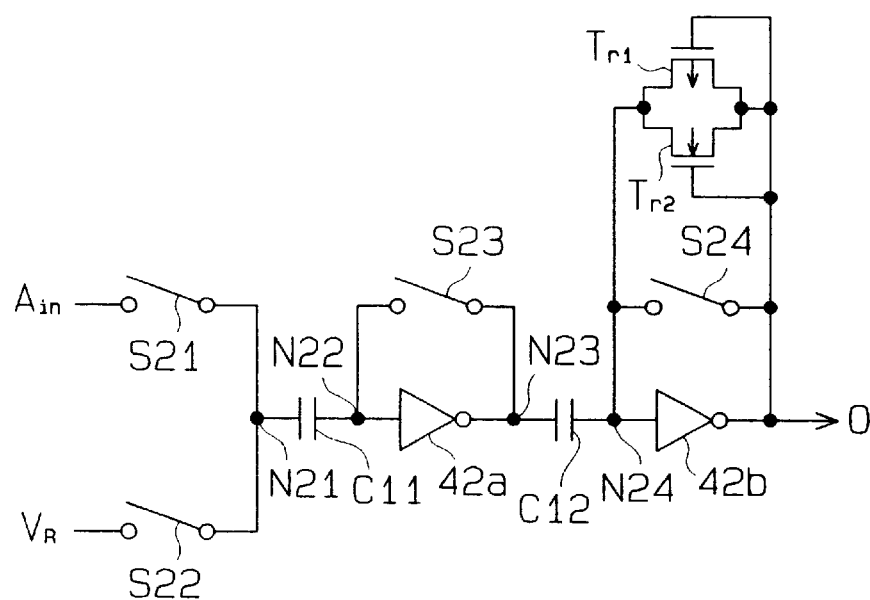
FIG. 31 is a circuit diagram of the eighth embodiment of the invention.

FIG. 31 shows a chopper type comparator according to the eighth embodiment which is a modification of the seventh embodiment. The eighth embodiment is fundamentally the same as the seventh embodiment, except that a P channel MOS transistor Tr1 and an N channel MOS transistor Tr2 are connected in parallel between the node N24 and the output terminal of the inverter circuit 42b in place of the diodes 41a and 41b in the seventh embodiment.

The gates of the transistors Tr1 and Tr2 are connected to the output terminal of the inverter circuit 42b. Accordingly, the transistor Tr1 serves as an MOS diode which is turned on when the input potential level of the inverter circuit 42b is higher than its output potential level by a value equal to or greater than the threshold voltage of the transistor Tr1. The transistor Tr2 serves as a diode which is turned on when the output potential level of the inverter circuit 42b is higher than its input potential level by a value equal to or greater than the threshold voltage of the transistor Tr2.

According to the comparator of the eighth embodiment, one of the transistors Tr1 and Tr2 is turned on when the difference between the potentials at the node N24 and the output terminal of the inverter circuit 42b becomes greater than the threshold voltage of either the transistor Tr1 or Tr2. Consequently, the difference between the potentials at the node N24 and the output terminal of the inverter circuit 42b becomes equal to the threshold voltage of either the transistor Tr1 or Tr2, thus suppressing the amplitude of the output signal O to that threshold voltage. Therefore, the transistors Tr1 and Tr2 serve as diode-connected elements to suppress the amplitude of the output signal of an amplifying unit.

According to the eighth embodiment like the seventh embodiment, the negative feedback loop including the transistors Tr1 and Tr2 suppresses the amplitude of the output signal O when the reference voltage $V_R$ is compared with the analog input signal Ain. This speeds up the reset operation which follows the comparison.

According to the comparator, as the negative feedback loop is provided between the input and output terminals of the inverter circuit 42b serving as an amplifying unit, the difference between the potentials at both ends of the capacitor C12 in the comparison operation cannot be kept at the potential difference in the reset operation. Unlike the comparator of the sixth embodiment, therefore, the comparator of the eighth embodiment cannot be used to perform a comparison operation multiple times in a single reset operation.

The transistors Tr1 and Tr2 which constitute the aforementioned MOS diode may be modified as follows:

(1) The gates of the transistors Tr1 and Tr2 are connected to the input terminal of the inverter circuit 42b;

(2) The transistors Tr1 and Tr2 are replaced with two N channel MOS transistors with the gate of one transistor being connected to the output terminal of the inverter circuit 42b while the gate of the other transistor is connected to the input terminal of the inverter circuit 42b; and (3) The transistors Tr1 and Tr2 are replaced with two P channel MOS transistors with the gate of one transistor being connected to the output terminal of the inverter circuit 42b while the gate of the other transistor is connected to the input terminal of the inverter circuit 42b.

NINTH EMBODIMENT

Figure 32:
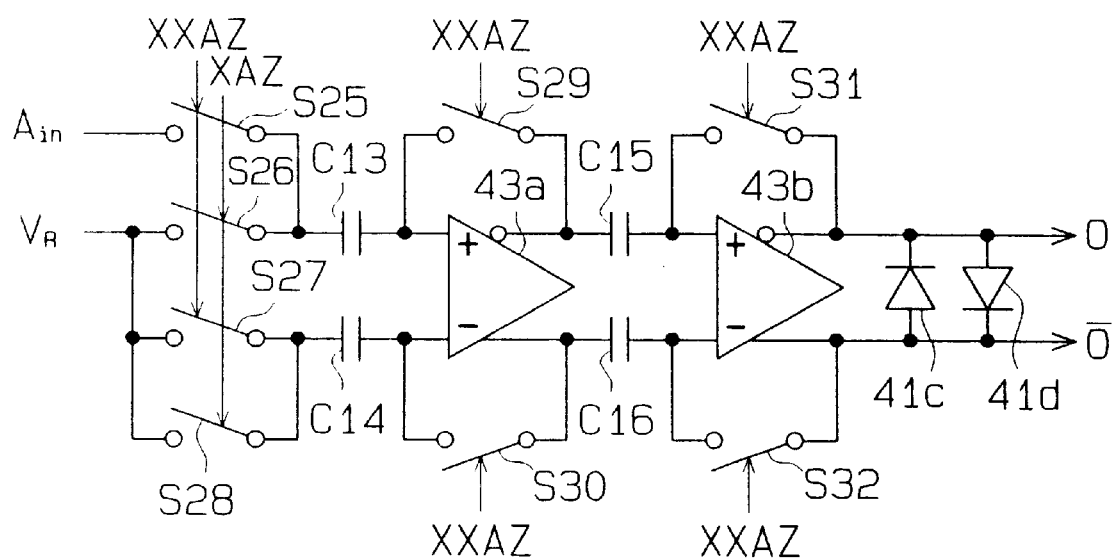
FIG. 32 is a circuit diagram of the ninth embodiment of the invention.

FIG. 32 shows a comparator according to the ninth embodiment. This comparator is equivalent to the comparator of the seventh embodiment whose inverter circuits 42a and 42b are replaced with differential amplifiers 43a and 43b as amplifying units.

The switch circuits S25, S27 and S29 to S32 are controlled by the control signal XXAZ, and the switch circuits S26 and S28 by the control signal XAZ. A pair of PN junction diodes 41c and 41d are connected in the opposite directions between the output terminals of the differential amplifier 43b.

According to this circuit structure, in the reset operation, the switch circuits S25, S27 and S29–S32 are turned on and the switch circuits S26 and S28 are turned off, so that the input and output terminals of the differential amplifiers 43a and 43b are reset to the same potentials. The analog input signal Ain is applied to a capacitor C13, and the reference voltage $V_R$ to a capacitor C14.

In the comparison operation, the switch circuits S25, S27 and S29–S32 are turned off and the switch circuits 526 and S28 are turned on. Consequently, the reference voltage $V_R$ is applied to both capacitors C13 and C14. Because of the capacitive coupling by the capacitor C13, the potential level at the positive input terminal of the differential amplifier 43a varies in accordance with the potential difference between the analog input signal Ain and the reference voltage $V_R$. As a result, a pair of signals reflecting the result of the comparison between the analog input signal Ain and the reference voltage $V_R$ are output from the differential amplifier 43a.

The output signal of the differential amplifier 43a is input to the differential amplifier 43b based on the capacitive coupling by capacitors C15 and C16. The differential amplifier 43b outputs complementary output signals O and /O based on the input signal.

Since the diodes 41c and 41d are connected between the output terminals of the differential amplifier 43b, the amplitudes of the output signals O and /O are suppressed to the forwardbiased voltage drop of the diodes 41c and 41d. Accordingly, the diodes 41c and 41d serve as a circuit to suppress the amplitude of the output signal of an amplifying unit.

According to the ninth embodiment, the amplitudes of the output signals O and /O are suppressed when the reference voltage $V_R$ is compared with the analog input signal Ain, so that the speed of the subsequent reset operation is improved.

The amplitudes of the output signals O and /O may be suppressed by removing the capacitors C15 and C16 between the two differential amplifiers 43a and 43b to directly connect those differential amplifiers 43a and 43b and by providing a pair of diodes between the input and output terminals of the differential amplifier 43b in the opposite directions. Further, a pair of diodes may be connected in the opposite directions between the two input terminals of the differential amplifier 43b to suppress the amplitudes of the output signals O and /O.

TENTH EMBODIMENT

Figure 33:
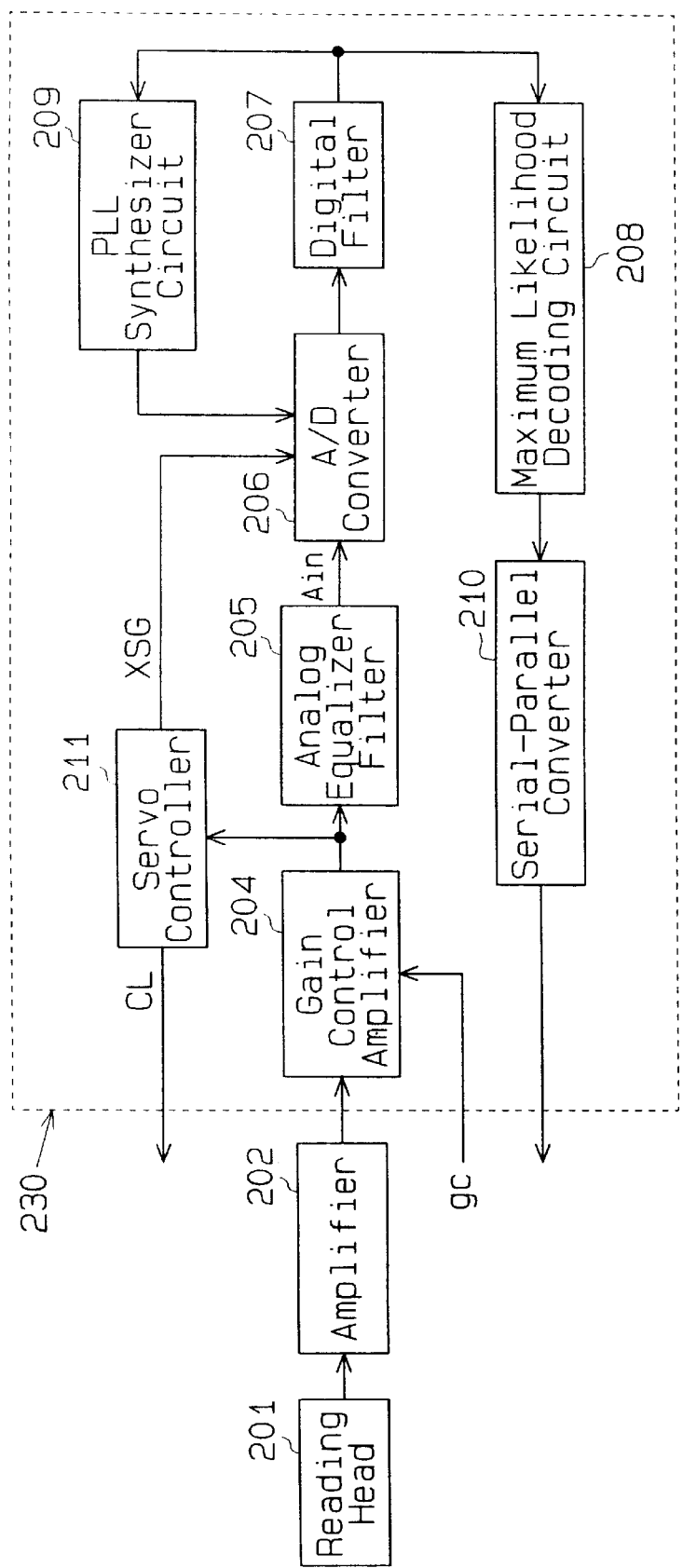
FIG. 33 is a block diagram of a recorded data reproducing apparatus according to the tenth embodiment of the present invention.

FIG. 33 shows a record data reproducing apparatus for reading data from a magnetic disk. A reading head 201 provided in a magnetic disk drive unit reads write data from a magnetic disk and supplies it to an amplifier 202. The amplifier 202 amplifies the analog data from the reading head 201. The amplified analog data is supplied to a gain control amplifier 204 in a read channel IC 230.

The gain control amplifier 204 controls the gain in response to an externally-supplied gain compensation signal gc. The gain control amplifier 204 produces an output signal of a predetermined level based on the signal input from the amplifier 202 and supplies it to an analog equalizer filter 205. The analog equalizer filter 205 equalizes the frequency response of the output signal of the gain control amplifier 204 to the desired response level, and supplies the equalized analog signal to an A/D converter section 206. The A/D converter section 206 converts the analog signal from the analog equalizer filter 205 to a digital signal and outputs the digital signal to a digital filter 207.

The digital filter 207 eliminates the undesirable digital signal component from the output digital signal of the A/D converter section 206, and outputs the filtered signal to a maximum likelihood decoding circuit 208. The maximum likelihood decoding circuit 208 performs a decoding operation based on a maximum likelihood decoding method, and supplies the decoded read data to a serial–parallel converter 210. The serial–parallel converter 210 converts the received serial data to parallel data and outputs it out of the read channel IC 203.

The output signal of the digital filter 207 is also supplied to a PLL synthesizer circuit 209, which in turn produces a sampling frequency signal for use in the A/D converter section 206 based on the output signal of the digital filter 207.

Figure 35:
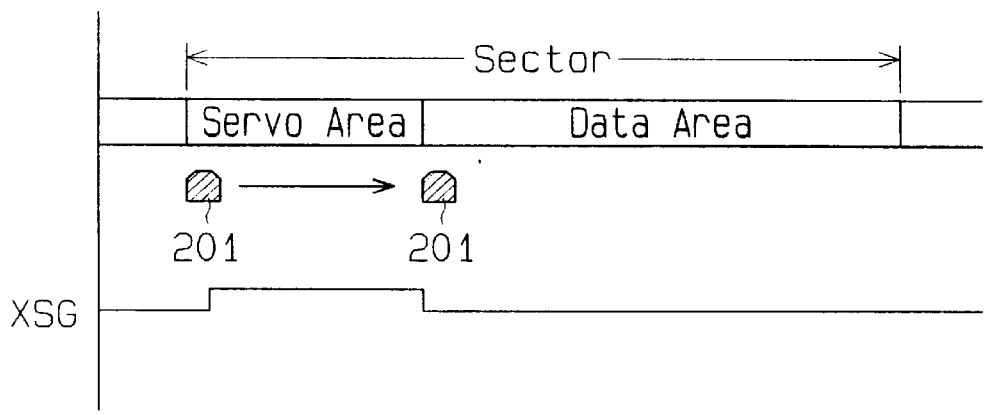
FIG. 35 is a diagram illustrating an operation of reading data from a servo area.

The output signal of the gain control amplifier 204 is also input to a servo controller 211. Based on the received signal, the servo controller 211 determines which sector on the magnetic disk the reading head 201 is searching, and outputs a control signal CL for driving the head to a reading head driving unit (not shown). As shown in FIG. 35, each sector on a magnetic disk generally includes a servo area and a data area. The servo controller 211 determines which is the reading head 201 accessing, the servo area or the data area in each sector. When the reading head 201 is accessing the servo area, for example, the servo controller 211 outputs an H-level control signal XSG to the A/D converter section 206.

Figure 34:
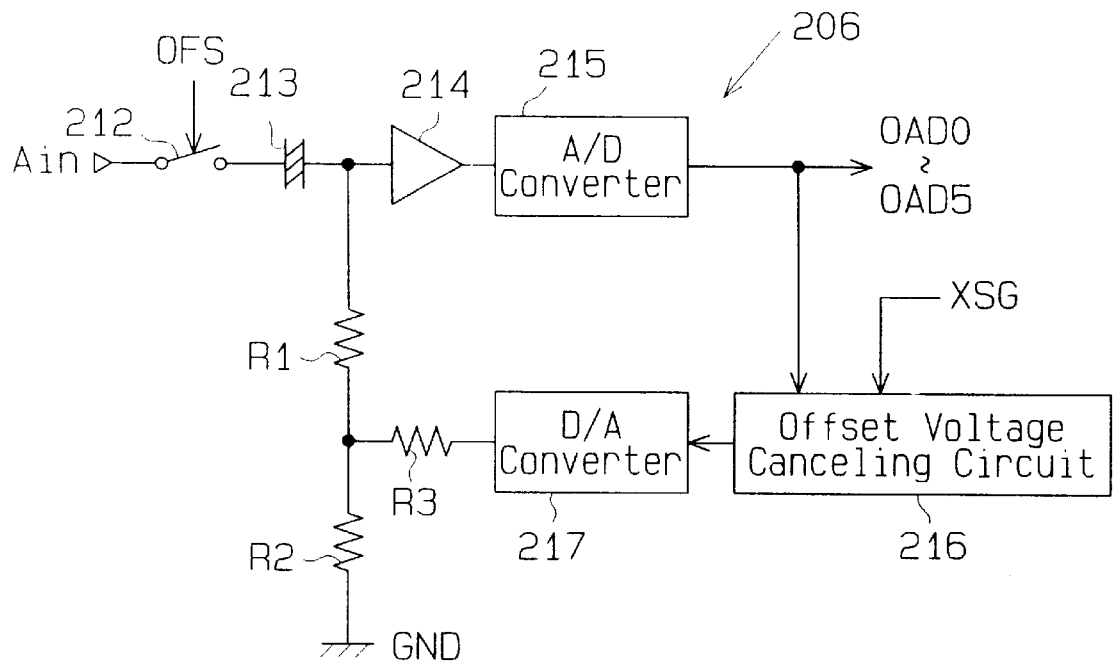
FIG. 34 is a circuit diagram showing an A/D converting section.

FIG. 34 shows the detailed circuit structure of the A/D converter section 206. An analog input signal Ain supplied to the A/D converter section 206 from the analog equalizer filter 205 is supplied to an amplifier 214 via a switch circuit 212 and a coupling capacitor 213. The switch circuit 212 is supplied with a control signal OFS which will be described later. When the control signal OFS is at an H level, the switch circuit 212 is turned on to supply the analog input signal Ain to the coupling capacitor 213.

The input terminal of the amplifier 214 is connected, via two resistors R1 and R2, to the ground GND. The amplifier 214 amplifies the analog input signal Ain, received via the coupling capacitor 213, and outputs the amplified signal to an A/D converter 215.

The A/D converter 215 converts the received analog signal to six 1-bit binary complement signals OAD0 to OAD5, and outputs those signals to the digital filter 207. When the potential of the analog signal input to the A/D converter 215 coincides with a center voltage, a set of the output signals OAD0–OAD4 of the A/D converter 215 becomes "00000". When the potential of the analog signal input to the A/D converter 215 is higher by one LSB (Least Significant Bit) than the center voltage, the set of the output signals OAD0–OAD4 becomes "00001". When the potential of the analog signal input to the A/D converter 215 is lower by one LSB than the center voltage, the set of the output signals OAD0–OAD4 becomes "11111". When the potential of the analog signal input to the A/D converter 215 is lower by two times the LSB than the center voltage, the set of the output signals OAD0–OAD4 becomes "11110". The digital signal OAD5 or the most significant bit indicates whether the input voltage to the A/D converter 215 is higher or lower than the center voltage, and is set to "0"when the input voltage is higher than the center voltage and is set to "1" when the input voltage is lower than the center voltage.

The set of the digital signals OAD0–OAD5 is also input to an offset voltage canceling circuit 216. Based on the digital signals OAD0–OAD5, the offset voltage canceling circuit 216 produces an 8-bit digital signal to cancel the offset voltage in the A/D converter 215. The 8-bit digital signal is supplied to a D/A converter 217. The D/A converter 217 converts the received digital signal to an analog voltage signal, and outputs it to a node between the resistors RI and R2 via a resistor R3. Therefore, the input voltage to the amplifier 214 varies in accordance with a change in the analog voltage output from the D/A converter 217, so that the input voltage to the A/D converter 215 is adjusted.

Figure 36:
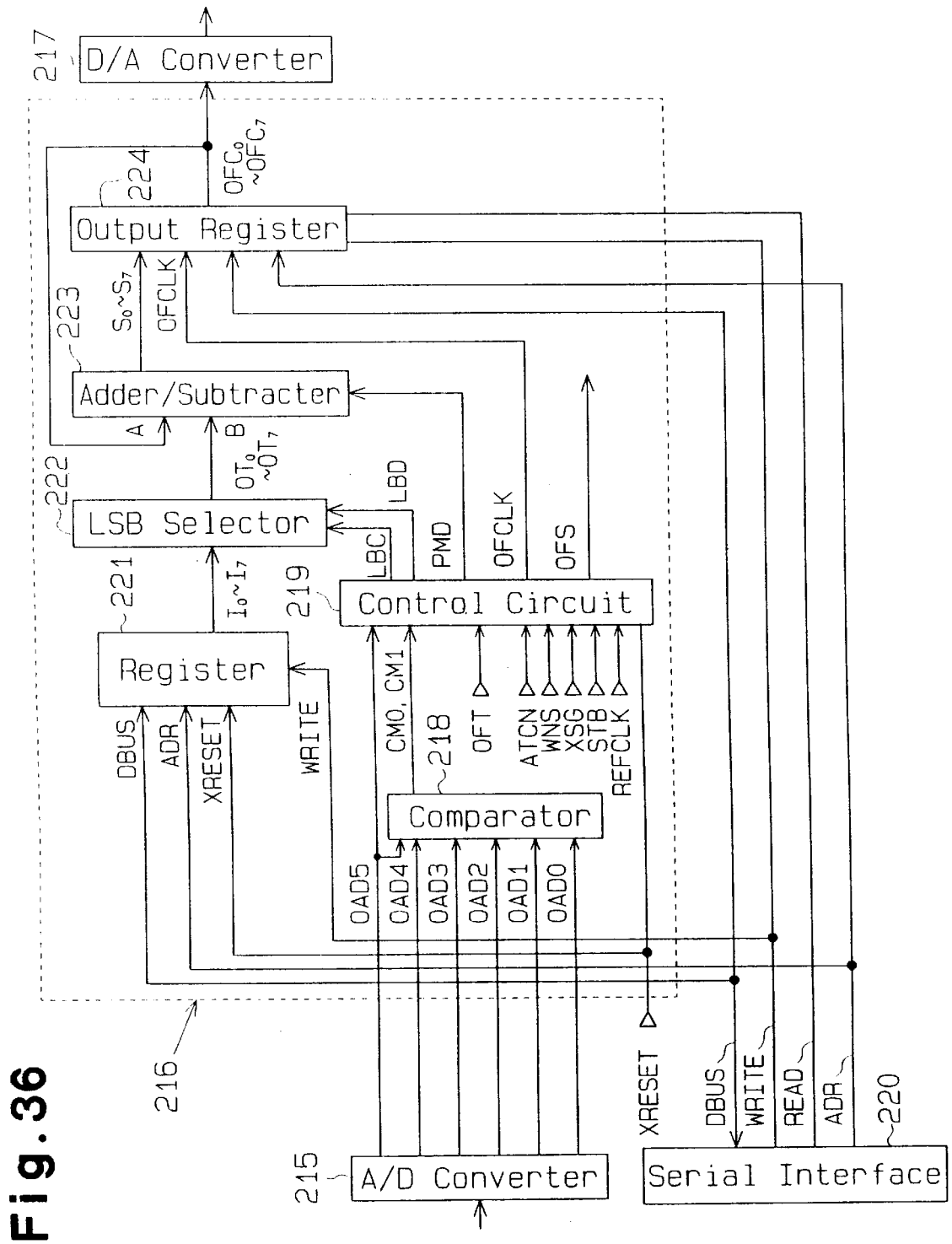
FIG. 36 is a block diagram showing an offset voltage canceling circuit.

FIG. 36 shows the detailed circuit structure of the offset voltage canceling circuit 216. The binary complement signals OAD0–OAD5 from the A/D converter 215 are input to a comparator 218. The most significant digital signal OAD5 is also supplied to a control circuit 219. The control circuit 219 determines that the input voltage is higher than the center voltage when the digital signal OAD5 is "0", and determines that the input voltage is lower than the center voltage when the digital signal OAD5 is "1".

Figure 37:
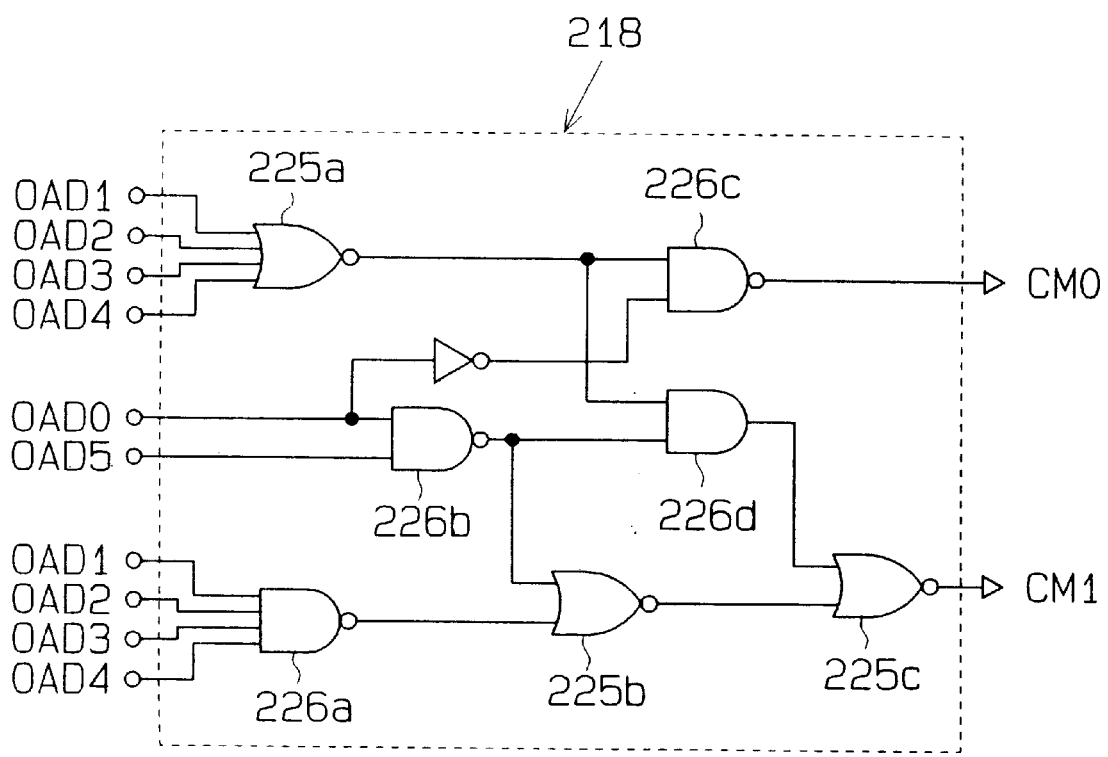
FIG. 37 is a circuit diagram showing a comparator.

FIG. 37 shows the detailed circuit structure of the comparator 218. The digital signals OAD1–OAD4 are input to a NOR gate 225a and a NAND gate 226a. The digital signals OAD0 and OAD5 are input to a NAND gate 226b, and the digital signal OAD0 is input to a NAND gate 226c via an inverter circuit. The output signal of the NOR gate 225a is input to the NAND gate 226c and an AND gate 226d. The output signal of the NAND gate 226b is input to the AND gate 226d and a NOR gate 225b. The output signal of the NAND gate 226a is input to the NOR gate 225b. The output signal of the NOR gate 225b is input to a NOR gate 225c. The output signal of the AND gate 226d is input to the NOR gate 225c. The NAND gate 226c produces an output signal CM0 and the NOR gate 225c produces an output signal CM1.

In the comparator 218, when the digital signals OAD0–OAD4 are all "0", the output signals CM0 and CM1 are both "0". When the digital signal OAD0 is "1" and the digital signals OAD1–OAD4 are "0", the output signal CM0 is "1" and the output signal CM1 is "0". When at least one of the digital signals OAD1–OAD4 becomes "1", the output signals CM0 and CM1 both become "1".

The output signals CM0 and CM1 are input to the control circuit 219 as shown in FIG. 36. When the output signals CM0 and CM1 both indicate "0", the control circuit 219 determines that the analog input voltage to the A/D converter 215 coincides with the center voltage, and sets a control signal LBD, one of its output signals, to an L level. When the output signal CM0 becomes "1" and the output signal CM1 becomes "0", the control circuit 219 determines that the difference between the analog input voltage to the A/D converter 215 and the center voltage is equal to or smaller than two times the LSB value of the A/D converter 215, and outputs an L-level control signal LBC. When the output signals CM0 and CM1 both become "1", the control circuit 219 determines that the difference between the analog input voltage to the A/D converter 215 and the center voltage is equal to or greater than two times the LSB value of the A/D converter 215, and outputs an H-level control signal LBC.

A control signal OFT is externally supplied to the control circuit 219. The period of an offset clock signal OFCLK output from the control circuit 219 is adjusted based on the control signal OFT.

A register 221, for use in setting the compensation amount, holds the value of an 8-bit binary code in the D/A converter 217, which corresponds to a one-LSB change in the potential of each of the digital output signals OAD0–OAD4 from the A/D converter 215. When a write control signal WRITE and an address signal ADR are input to the register 221 from an external MPU via a serial interface 220, externally supplied data is written, via data bus DBUS, to an address in the register 221 which is selected by the address signal ADR. The data stored in the register 221 can be erased by a reset signal XRESET externally supplied thereto.

Eight-bit data I0 to I7 stored in the register 221 are supplied to an LSB selecting circuit 222 which is also supplied with the control signals LBC and LBD from the control circuit 219. Based on the control signal LBC, the LSB selecting circuit 222 selects one of three modes: a rough-operation mode for directly outputting the input data I0–I7; a fine-operation mode for shifting the input data I0–I7 by two bits to the least significant bit side and then outputting the resultant data; and a zero-output mode for setting the input data I0–I7 all to "0" and then outputting the resultant data.

Figure 38:
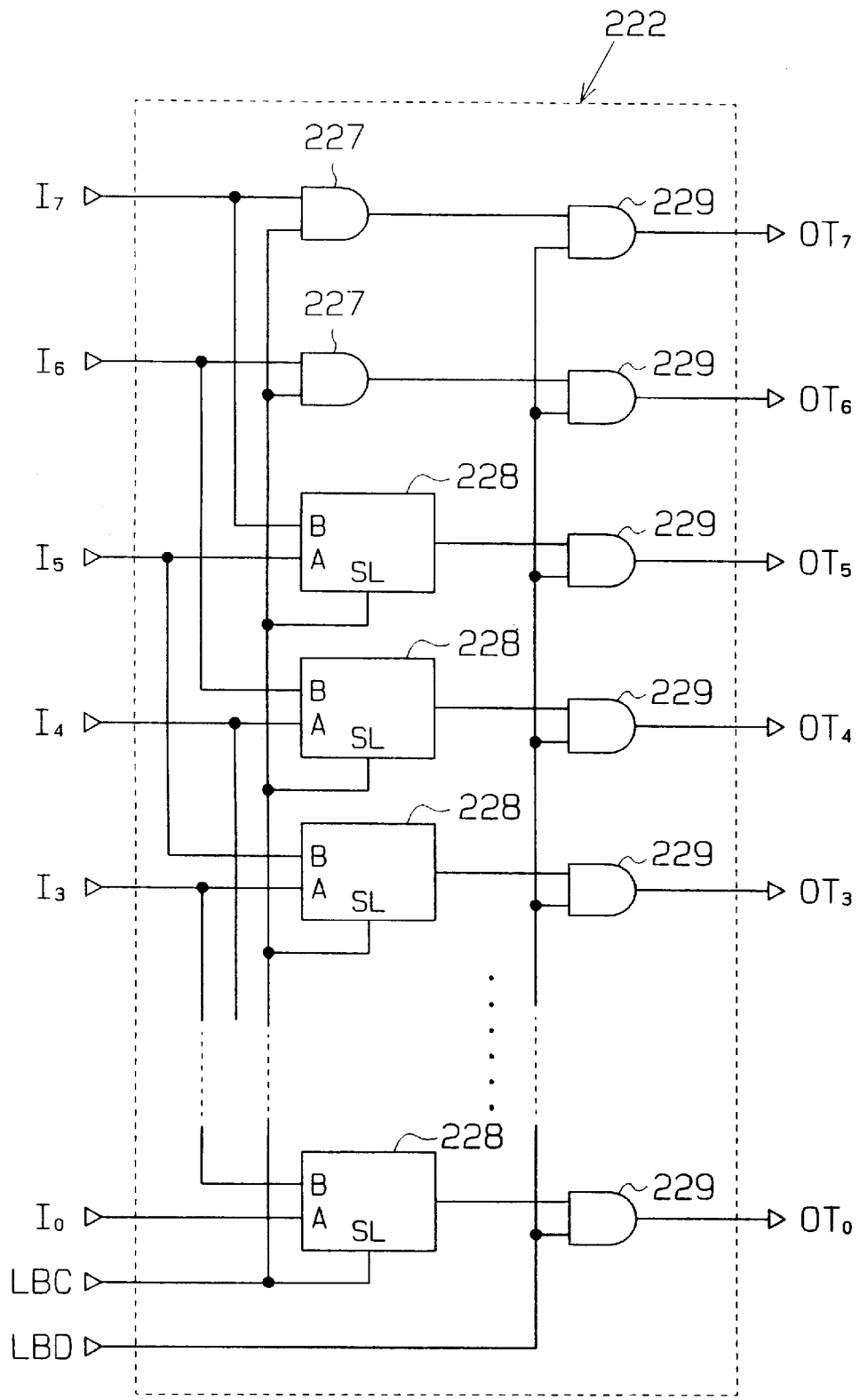
FIG. 38 is a circuit diagram showing an LSB selector.

FIG. 38 shows the detailed circuit structure of the LSB selecting circuit 222. The LSB selecting circuit 222 includes two AND gates 227 and six selectors 228 (four of them are shown) at a front stage, and eight AND gates 229 at a rear stage. The input data I7 and I6 are input to the respective AND gates 227, and the input data I5–I0 are input to input terminals A of the respective selectors 228. The input data I7–I2 are input to input terminals B of the respective selectors 228 whose input terminals A are supplied with the input data I5–I0, each two bits lower than the input data I7–I2.

The control signal LBC output from the control circuit 219 is supplied to the AND gates 227 and the input terminals SL of the selectors 228. Each selector outputs the signal input to the input terminal A when the control signal LBC input to the input terminal SL goes high, and outputs the signal input to the input terminal B when the control signal LBC input to the input terminal SL goes low.

The output signals of the AND gates 227 and the selectors 228 are output to the respective AND gates 229 at the subsequent stages. The AND gates 229 also receive the control signal LBD from the control circuit 219. The AND gates 229 output eight 1-bit output signals OT7–OT0, respectively.

When the control signals LBC and LBD both go high, the LSB selecting circuit 222 directly outputs the input data I7–I0 as the eight 1-bit output signals OT7–OT0. When the control signal LBC goes low with the control signal LBD kept high, the LSB selecting circuit 222 shifts the input data I7–I2 by two bits to the least significant bit side and outputs the resultant data as the output signals OT5–OT0. In this case, the output signals OT7 and OT6 are set to "0". Therefore, the digital value that is represented by the output signals OT7–OT0 becomes one fourth the value of the input data I7–I0, which is a binary code value of the D/A converter 217 equivalent to one fourth the value of the LSB of the A/D converter 215. When the control signal LBD goes low, the output signals OT0–OT7 are all set to "0".

As shown in FIG. 36, the output signals OT0–OT7 of the LSB selecting circuit 222 are input to an adder/subtracter 223. The adder/subtracter 223 also receives eight 1-bit output signals OFC0 to OFC7 of an output register 224 (which will be discussed later) and a control signal PMD output from the control circuit 219. This control signal PMD goes low when the output signal OAD5 of the most significant bit of the A/D converter 215 indicates "0", and goes high when the output signal OAD5 indicates "1". In response to the control signal PMD, the adder/subtracter 223 executes addition or subtraction of the input signals OFC0–OFC7 and the associated input signals OT0–OT7.

Figure 39:
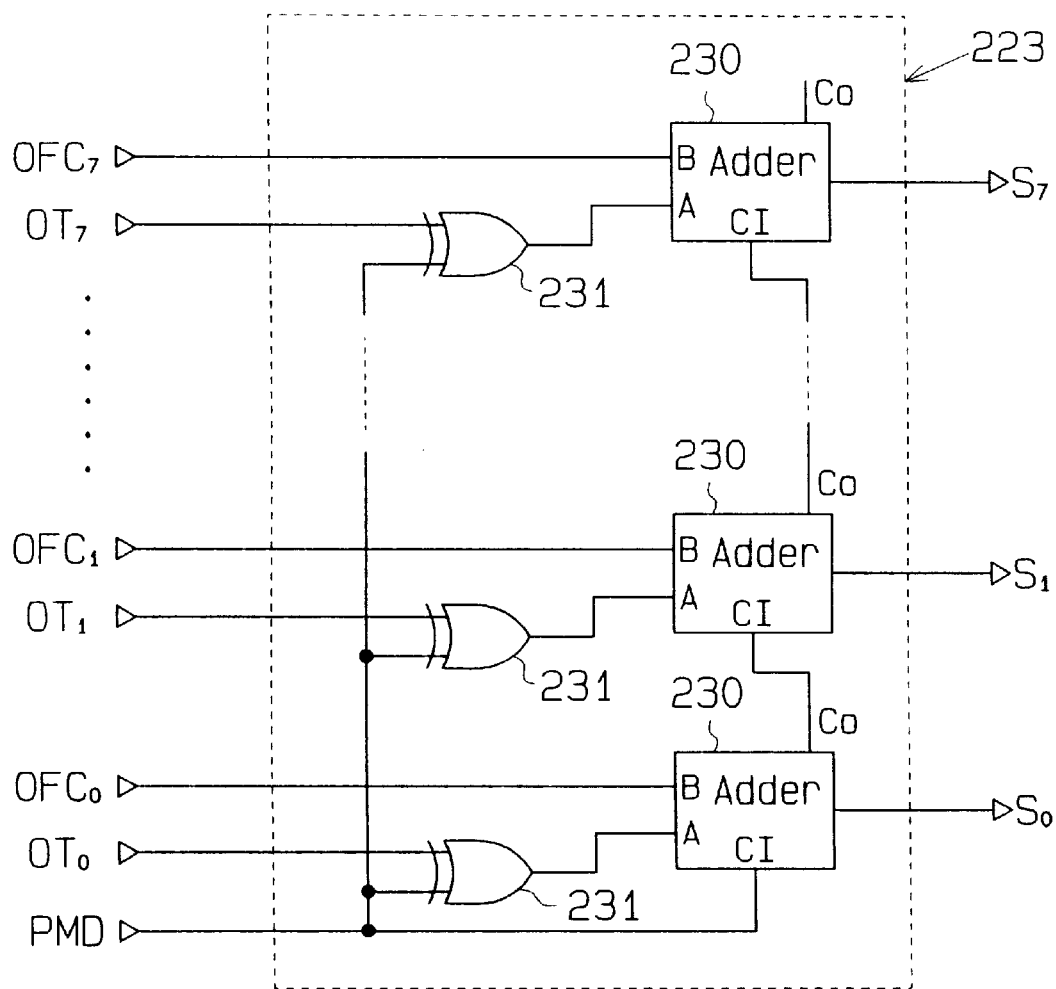
FIG. 39 is a circuit diagram showing an adding/subtracting circuit.

FIG. 39 shows the detailed circuit structure of the adder/subtracter 223. The adder/subtracter 223 includes eight adders 230 (only three shown) and eight exclusive OR (EOR) gates 231 (only three shown). The input signals OFC0–OFC7 are input to the respective adders 230. The input signals OT0–OT7 are input to the first input terminals of the respective EOR gates 231 whose second input terminals are supplied with the control signal PMD. The output signals of the individual EOR gates 231 are input to the associated adders 230, which output the output signals S0–S7 of the adder/subtracter 223.

In the adder/subtracter 223, when the control signal PMD goes high, the individual EOR gates 231 output signals in phase with the input signals OT0–OT7. Consequently, the individual adders 230 add the input signals OFC0–OFC7 to the associated input signals OT0–OT7 to yield the output signals S0–S7. When the control signal PMD goes low, each EOR gate 231 outputs a signal which is the inverted form of the associated one of the input signals OT0–OT7. As a result, the individual adders 230 substantially perform the subtraction of the input signals OT0–OT7 from the associated input signals OFC0–OFC7, and the subtraction results are output as the output signals S0–S7.

As shown in FIG. 36, the output signals S0–S7 of the adder/subtracter 223 are supplied to the output register 224, which is supplied with the offset clock signal OFCLK from the control circuit 219. Every time the offset clock signal OFCLK rises, the output register 224 renews the data stored therein based on the output signals S0–S7 of the adder/subtracter 223, and outputs the renewed data as the output signals OFC0–OFC7 to the D/A converter 217.

The output register 224 executes data writing and outputting of the stored data, in response to the signals which are received via the serial interface 220 from the external MPU (not shown). More specifically, when the write signal WRITE and address signal ADR are input to the output register 224 from the external MPU, write data is written, via the data bus DBUS, to a selected address in the register 224. When the read signal READ and address signal ADR are input to the output register 224 from the external MPU, the data stored at the selected address is read from the register 224 via the data bus DBUS.

The control circuit 219 receives the control signal XSG from the servo controller 211. In response to the control signal XSG, the control circuit 219 outputs the control signal OFS to the switch circuit 212 shown in FIG. 34.

The control circuit 219 is externally supplied with a control signal ATCN. Based on the input of the control signal ATCN, the control circuit 219 outputs a control signal OFS regardless of the control signal XSG, and causes the operation of the offset canceling circuit 216 to start.

The control circuit 219 is externally supplied with a control signal WNS, which is used to control the control signals LBC and LBD to be output to the LSB selecting circuit 222 in order to select the rough-operation mode or the fineoperation mode upon outputting the output signals OT0–OT7 from the LSB selecting circuit 222.

The control circuit 219 is also externally supplied with a control signal STB which serves to enable the control circuit 219. A reference clock signal REFCLK externally supplied to the control circuit 219 is used as a reference signal to generate the offset clock signal OFCLK.

A description will be now given of the offset voltage canceling operation by the A/D converter section 206 in the record data reproducing apparatus according to the tenth embodiment.

When the reading head 201 starts reading data from the servo area in a sector, the servo controller 211 outputs the control signal XSG to the A/D converter section 206. When the control signal XSG is input to the control circuit 219 in the offset voltage canceling circuit 216, the control circuit 219 outputs the control signal OFS to the switch circuit 212 to turn off the switch circuit 212.

Under this situation, the offset voltage canceling circuit 216 operates to set the input voltage to the A/D converter 215 to the center voltage. When the input voltage to the A/D converter 215 is higher than the center voltage by at least two times the LSB, the digital signal OAD5 of the most significant bit output from the A/D converter 215 becomes "0" and at least one of the digital signals OAD1–OAD4 becomes "1" so that the output signals CM0 and CM1 of the comparator 218 both become "1".

Then, the control signals LBC and LBD from the control circuit 219 both go high and the control signal PMD goes low. In response to the H-level control signals LBC and LBD, the LSB selecting circuit 222 outputs the input signals I0–I7 as the output signals OT0–OT7 in accordance with the rough-operation mode.

In response to the L-level control signal PMD, the adder/subtracter 223 enters the subtraction mode. The adder/subtracter 223 subtracts the input signals OT0–OT7 in the rough-operation mode from the associated output signals OFC0–OFC7 of the register 224, and outputs the subtraction results as the output signals S0–S7 to the output register 224.

Upon each rising of the offset clock signal OFCLK, the output register 224 receives the output signals S0–S7 from the adder/subtracter 223 and outputs the registered signals as the output signals OFC0–OFC7 to the D/A converter 217. As the D/A converter 217 converts the subtracted input signals S0–S7 to analog voltage signals, the output voltage of the D/A converter 217 falls. As a result, the input voltage to the amplifier 214 which is set based on the resistors R1–R3 drops and the offset value of the analog input voltage to the A/D converter 215 thus becomes smaller to approach the center voltage.

When the offset value of the analog input voltage to the A/D converter 215 becomes smaller and when only the signal OAD0 among the output signals OAD5–OAD0 of the A/D converter 215 becomes "1", the output signal CM0 of the comparator 218 is set to indicate "1" and the output signal CM1 is set to indicate "0". Consequently, the control signal LBC goes low, and the LSB selecting circuit 222 shifts the input signals I0–I7 each by two bits to the least significant bit side in accordance with the fine-operation mode, and outputs the signals OT0–OT7.

The control signal PMD is kept at an L level and the adder/subtracter 223 is kept in the subtraction mode. As a result, the adder/subtracter 223 subtracts the input signals OT0–OT7 in the fine-operation mode from the associated output signals OFC0–OFC7 of the register 224, and supplies the subtraction results as the output signals S0–S7 to the output register 224.

Upon each rising of the offset clock signal OFCLK, the output register 224 receives the output signals S0–S7 from the adder/subtracter 223 and outputs the registered signals to the D/A converter 217, as described above. The D/A converter 217 converts the output signals OFC0–OFC7, obtained by the subtraction by a small amount in the fine-operation mode, to analog voltage signals. Consequently, the output voltage of the D/A converter 217 decreases by a small amount. This results in a small reduction of the input voltage to the amplifier 214 so that the analog input voltage to the A/D converter 215 further approaches the center voltage.

When the analog input voltage to the A/D converter 215 reaches the center voltage, the digital output signals OAD0–OAD5 of the A/D converter 215 all become "0". Consequently, the output signals CM0 and CM1 of the comparator 218 both become "0" and the control signal LBD is set to indicate "0". The output signals OT0–OT7 of the LSB selecting circuit 222 all become "0" so that the output signals S0–S7 of the adder/subtracter 223 and the output signals OFC0–OFC7 of the output register 224 become constant. Therefore, the output voltage of the D/A converter 217 becomes constant and the analog input voltage to the A/D converter 215 is kept at the center voltage.

When the input voltage to the A/D converter 215 is lower than the center voltage, the digital output signal OAD5 is set to "1" and the control signal PMD goes high. As a result, the same operation as explained above is performed except that the adder/subtracter 223 becomes the addition mode, thereby canceling the offset of the analog input voltage to the A/D converter 215.

When the reading of the servo area by the reading head 201 is terminated and when data reading from the data area starts, the outputting of the control signal XSG from the servo controller 211 is stopped, the outputting of the control signal OFS is stopped, and the control signal LBD goes low. Then, the output signals OT0–OT7 of the LSB selecting circuit 222 are all kept at "0" so that the output voltage of the D/A converter 217 is kept constant.

Then, the switch circuit 212 is turned on to allow the analog input signal Ain according to the data read from the data area to be input to the A/D converter section 206. The A/D converter 215 can execute A/D conversion in the situation where the offset voltage is canceled. When data reading from the data area is terminated and when the reading of the servo area starts again, the above-described offset-voltage canceling operation starts again.

According to the A/D converter section 206, as described above, when the reading of the servo area by the reading head 201 starts, the switch circuit 212 is turned off to inhibit the inputting of the analog input signal Ain, so that the closed loop circuit is formed by the amplifier 214, A/D converter 215, offset voltage canceling circuit 216, D1A converter 217 and resistors R1–R3. The offset voltage of the A/D converter 215 can be therefore automatically canceled by the action of the offset voltage canceling circuit 216.

The offset voltage canceling circuit 216 is activated in response to the control signal XSG that is input to the circuit 216 in synchronism with the operation of reading the servo area. The comparator 218 in the circuit 216 detects the degree of the offset value. The LSB selecting circuit 222 selects either the rough-operation mode or the fine-operation mode. The operation of canceling the offset voltage in response to the rising of the offset clock signal OFCLK is executed by one LSB of the A/D converter 215 at a time in the rough-operation mode, and is executed by one fourth of the LSB of the A/D converter 215 at a time in the fine-operation mode.

This operation can promptly reduce the offset voltage of the A/D converter 215 when this offset voltage is large. It is also possible to perform fine adjustment so that as the offset voltage is reduced, the offset voltage approaches "0". Therefore, the offset-voltage canceling operation is executed at a high speed and high precision. The precision of A/D conversion by the A/D converter 215 is thus improved.

The setting of the offset clock signal OFCLK for setting the updating cycle of the output signals OFC0–OFC7 of the output register 224 can be changed based on the control signal OFT which is externally supplied. By properly setting the updating cycle, it is possible to prevent the output signals OFC0–OFC7 of the register 224 from unnecessarily varying due to a change in the output signals S0–S7 of the adder/subtracter 223, thus stabilizing the output voltage of the D/A converter 217.

Although only several embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. An A/D converter comprising:
   a reference voltage generating circuit for producing a predetermined number of different reference voltages;
   a plurality of comparators supplied with an input voltage and the reference voltages respectively, each comparator comparing one of the reference voltages with the input voltage and generating a comparison signal;
   a switching circuit connected between the reference voltage generating circuit and the plurality of comparators, for selecting the reference voltages provided to the plurality of comparators;
   an output unit for receiving the comparison signals and generating a predetermined number of comparison output signals the number of which is smaller by more than one of the comparison signals; and
   a control circuit for controlling the switching circuit selecting the reference voltages such that the output unit generates the predetermined number of comparison output signals based on a combination of the comparison signals, and wherein the comparators which are not concerned with the output signals and the number of which is smaller than the predetermined number are reset, and the reset comparators are changed in a predetermined order.

2. The A/D converter of claim 1, wherein output points of the predetermined number of the comparison output signals correlate with the predetermined number of reference voltages, and when the control circuit changes the comparators performing the comparison operations, the output unit switches the output points of the comparison output signals output from the changed comparators to the output points of the comparison output signals corresponding to the correlation of the predetermined number of reference voltages.

3. The A/D converter of claim 2, wherein the predetermined number of the comparison output signals are represented by a thermometer code.

4. The A/D converter of claim 1, wherein each of the comparators comprises a chopper type comparator.

5. The A/D converter of claim 4, wherein each of the comparators performs multiple comparison operations between reset operations.

6. The A/D converter of claim 5, wherein each of the comparators includes an amplitude suppressing circuit for suppressing an amplitude of the comparison signal.

7. The A/D converter of claim 6, wherein each of the comparators further includes:
   first and second amplifying units; and
   a capacitor element connected between the first and second amplifying units,
   wherein the amplitude suppressing circuit includes a switching unit connected in parallel to the second amplifying unit to form a negative feedback path via the capacitor element when the switching unit is made conductive by applying a voltage greater than a predetermined voltage to the switching unit.

8. The A/D converter of claim 7, wherein the switching unit includes a pair of bidirectional diodes.

9. The A/D converter of claim 8, wherein each of the bidirectional diodes includes a PN junction diode.

10. The A/D converter of claim 9, wherein each of the bidirectional diodes includes a MOS diode.

11. The A/D converter of claim 6, wherein each of the comparators further includes:
    a differential amplifier having a pair of output terminals, and
    wherein the amplitude suppressing circuit includes a pair of switching units, connected between the pair of output terminals, for conducting when a voltage greater than a predetermined voltage is applied thereto.

12. The A/D converter of claim 11, wherein the switching unit includes a pair of bidirectional diodes.

13. The A/D converter of claim 12, wherein each of the bidirectional diodes includes a PN junction diode.

14. The A/D converter of claim 12, wherein each of the bidirectional diodes includes a MOS diode.

15. The A/D converter of claim 6, wherein each of the comparators further includes a differential amplifier having a pair of input terminals, and
    wherein the amplitude suppressing circuit includes a pair of switching units connected between the pair of input terminals, the switching units conducting when a voltage greater than a predetermined voltage is applied thereto.

16. The A/D converter of claim 15, wherein the switching unit includes a pair of bidirectional diodes.

17. The A/D converter of claim 16, wherein each of the bidirectional diodes includes a PN junction diode.

18. The A/D converter of claim 16, wherein each of the bidirectional diodes includes a MOS diode.

19. An A/D converter comprising:
    a plurality of chopper type comparators, each performing a comparison operation between an input voltage and a respective one of a plurality of reference voltages, outputting an output signal and performing a reset operation, wherein each of the comparators includes, first and second amplifying units, and
    a capacitor element connected between the first and second amplifying units;
    a control circuit controlling the plurality of chopper type comparators to perform multiple comparison operations between the reset operations; and
    a plurality of switching units, each connected to a respective one of the second amplifying units to form a negative feedback path via the capacitor element when the switching unit is made conductive, when a voltage greater than a predetermined voltage is applied thereto, wherein the switching units each include a pair of bidirectional diodes.

20. The A/D converter of claim 19, wherein each of the bidirectional diodes includes a PN junction diode.

21. The A/D converter of claim 20, wherein each of the bidirectional diodes includes a MOS diode.

22. An A/D converter comprising:
    a plurality of chopper type comparators, each performing a comparison operation between an input voltage and a respective one of a plurality of reference voltages to output an output signal and performing a reset operation, wherein each of the comparators includes a differential amplifier having a pair of output terminals;

a control circuit controlling the plurality of chopper type comparators to perform multiple comparison operations between the reset operations; and a plurality of pairs of switching units, each pair connected between the pairs of output terminals, the switching units being made conductive when a voltage greater than a predetermined voltage is applied thereto, wherein the switching units each include a pair of bidirectional diodes.

23. The A/D converter of claim 22, wherein each of the bidirectional diodes includes a PN junction diode.

24. The A/D converter of claim 23, wherein each of the bidirectional diodes includes a MOS diode.

25. An A/D converter comprising:

a plurality of chopper type comparators, each performing a comparison operation between an input voltage and a respect one of a plurality of reference voltages to output an output signal and performing a reset operation, wherein each of the comparators includes a differential amplifier having a pair of input terminals;

a control circuit controlling the plurality of chopper type comparators to perform multiple comparison operations between the reset operations; and a plurality of pairs of switching units each pair connected between the pairs of input terminals, the switching units being made conductive when a voltage greater than predetermined voltage is applied thereto, wherein the switching units each include a pair of bidirectional diodes.

26. The A/D converter of claim 25, wherein each of the bidirectional diodes includes a PN junction diode.

27. The A/D converter of claim 26, wherein each of the bidirectional diodes includes a MOS diode.

* * * * *

UNITED STATES PATENT AND TRADEMARK OFFICE
CERTIFICATE OF CORRECTION

PATENT NO.    : 6,288,665 B1
DATED         : September 11, 2001
INVENTOR(S)   : Sanroku Tsukamoto et al.

It is certified that error appears in the above-identified patent and that said Letters Patent is hereby corrected as shown below:

<u>Title page,</u>
Please change the following information:
[62]    Division of application no. 08/603,607, filed on Feb. 21, 1996, now Pat. No. <u>6,046,694</u> to
[62]    Division of application No. 08/603,607, filed on Feb. 21, 1996, now Pat. No. -- 6,288,668 B1 --.

Signed and Sealed this

Twenty-sixth Day of March, 2002

Attest:

JAMES E. ROGAN
*Attesting Officer*       *Director of the United States Patent and Trademark Office*